US012713541B2

(12) United States Patent
Watamura et al.

(10) Patent No.: US 12,713,541 B2
(45) Date of Patent: Aug. 18, 2026

(54) ELECTRONIC APPARATUS HAVING A FLAT RECTANGULAR CHASSIS

(71) Applicant: Lenovo (Singapore) Pte. Ltd., Singapore (SG)

(72) Inventors: Kenji Watamura, Kanagawa (JP); Tabito Miyamoto, Kanagawa (JP); Seita Horikoshi, Kanagawa (JP); Yuichi Onda, Kanagawa (JP); Kazuo Fujii, Kanagawa (JP); Tin-Lup Wong, Morrisville, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 111 days.

(21) Appl. No.: 18/763,504

(22) Filed: Jul. 3, 2024

(65) Prior Publication Data

US 2026/0013052 A1 Jan. 8, 2026

(51) Int. Cl.
*H05K 5/00* (2025.01)
*H05K 5/02* (2006.01)

(52) U.S. Cl.
CPC ......... *H05K 5/0043* (2013.01); *H05K 5/0052* (2013.01); *H05K 5/0256* (2013.01)

(58) Field of Classification Search
CPC .... H03K 5/1252; H01B 11/00; H01R 31/065; H02M 3/003
See application file for complete search history.

(56) References Cited

U.S. PATENT DOCUMENTS 5,526,227 A * 6/1996 Satou .................... G06F 1/1616 361/753
8,456,814 B2 * 6/2013 Gerovac .................. H02B 1/38 361/679.01
8,897,005 B2 * 11/2014 Huang ..................... H05K 7/16 361/679.01
10,645,821 B1 * 5/2020 Cheng ...................... H05K 5/10
11,112,631 B2 * 9/2021 Oh .................... G02F 1/133608
11,611,171 B2 * 3/2023 Sumida .................... H02G 3/16

FOREIGN PATENT DOCUMENTS

JP S57154893 A 9/1982
JP 2022052256 A 4/2022

* cited by examiner

*Primary Examiner* — Imani N Hayman
*Assistant Examiner* — Hung Q Dang
(74) *Attorney, Agent, or Firm* — Osha Bergman Watanabe & Burton LLP

(57) ABSTRACT

An electronic apparatus includes: a flat rectangular chassis that includes a side wall frame in which at least three side walls are formed by bending an extruded material, a cover configured to form one surface of the chassis by being combined with the side wall frame, and a plate frame that has a plate shape and is provided between facing portions of the three side walls. The plate frame includes two partition walls having an angle intersecting with a plate-shaped portion, and forms a space surrounded on three sides by the plate-shaped portion and the two partition walls. A stop block is fitted into the space from a side. A portion of an edge portion of the cover is sandwiched between the side wall frame and the stop block. An IO connector is provided at the stop block.

6 Claims, 19 Drawing Sheets

52B
34
28a
56j
28c
28a
56h
28d
28e
28b
28
Y2
Y
Y1
X 52A
34
28a
56j
28c
28a
56h
28d
28e
28b
28
Y2
Y
Y1
X 54A,28
54b
54f
54e
34b
24
34
26
26d
54c
26e
54a
54g
54ca
X
Y
Z 54B,28
54b
54f
54e
54d
24
26B
54a
26f
54i
54h
Z 54C,28
54b
54f
54e
54d
24
26c
54k
54j
54a
Z 54D,28
24D
24b
26
26d
54d
54e
54m
54ma
54n
24c
54a
54g
54ca
26e
54c
Z 56b
56a
34A
56c
Y1
Y
Y2
Z 34B
56a
56b
56c 56c
34C
56a
56b 34D
56a
56b
56c 34E
56a
56b
56c 34F
56a
56b
56c 34G
56b
56c
56a 56m
34H
56b
56c
56a 34I
56a
56b
56c 34J
56a
56b
56c 34K
56aa
56a
56b
56c 34L
56ab
56a
56b
56c

ELECTRONIC APPARATUS HAVING A FLAT RECTANGULAR CHASSIS

TECHNICAL FIELD

The present invention relates to an electronic apparatus having a flat rectangular chassis.

BACKGROUND

A chassis of an electronic apparatus such as a notebook-type personal computer (laptop PC) forms a flat rectangular box shape by an upper cover and a lower cover, and a control board, a battery, and the like are mounted in an internal space. A side wall of the chassis is integrally configured with the upper cover or the lower cover and has a shallow tray shape, which is referred to as a unibody design, in many chassis.

There is a social demand for reducing environmental loads, and suppression of energy consumption and materials during manufacturing and repairability for reducing waste after manufacturing have also been required for electronic apparatuses.

In the unibody design that is currently popular, the chassis having the tray shape is formed by cutting a material block by CNC processing, and thus the energy consumption is large and the processing time is long. In addition, the cutting amount is large, and thus the material efficiency for the material block is very low. The savings during the production are recycled, but a large amount of energy is consumed even in the recycling. Although the consideration is also given to molding the chassis, it is not possible to sufficiently improve the material efficiency even when the molding is adopted. Furthermore, there is an increase in product cost.

SUMMARY

One or more embodiments of the present invention provide an electronic apparatus capable of reducing an environmental load.

According to one or more embodiments of the present invention, an electronic apparatus includes a flat rectangular chassis that includes a side wall frame in which at least three side walls are formed by bending an extruded material, a cover configured to form one surface of the chassis by being combined with the side wall frame, and a plate frame that has a plate shape and is provided between facing portions of the three side walls. The plate frame includes two partition walls having an angle intersecting with a plate-shaped portion, and forms a space surrounded on three sides by the plate-shaped portion and the two partition walls, a stop block is fitted into the space from a side, a portion of an edge portion of the cover is sandwiched between the side wall frame and the stop block, and an IO connector is provided at the stop block.

According to one or more embodiments of the present invention, it is possible to reduce the environmental load.

DETAILED DESCRIPTION

Hereinafter, embodiments of an electronic apparatus according to the present invention will be described in detail based on the drawings. It should be noted that the present invention is not limited to the embodiments.

Figure 1:
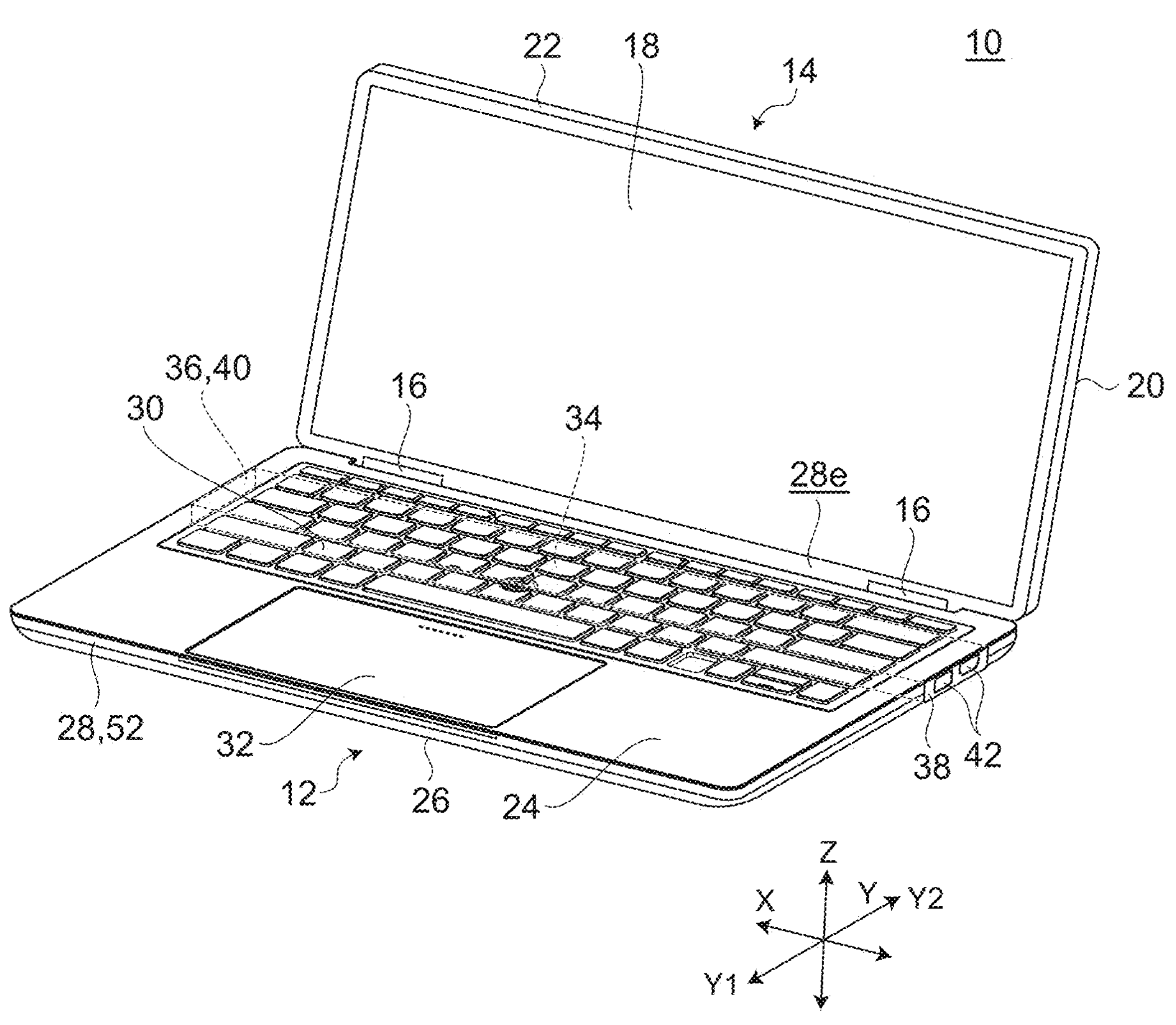
FIG. 1 is a perspective view of an electronic apparatus according to one or more embodiments.
Figure 2:
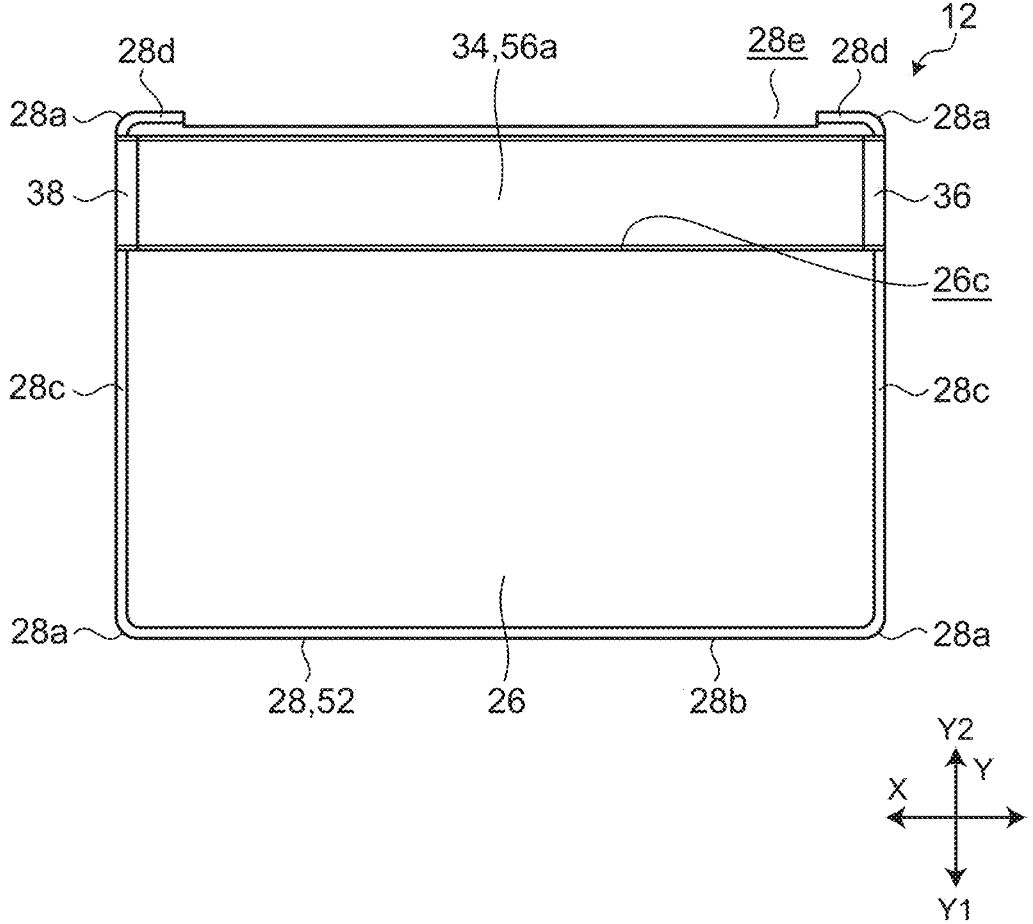
FIG. 2 is a bottom view of a main body chassis in the electronic apparatus.

FIG. 1 is a perspective view of an electronic apparatus 10 according to one or more embodiments. FIG. 2 is a bottom view of a main body chassis 12 in the electronic apparatus 10. In one or more embodiments, a laptop PC is used as the electronic apparatus 10 as an example. The electronic apparatus 10 may be a tablet-type PC, a smartphone, or the like having a flat and rectangular chassis. FIG. 1 illustrates the electronic apparatus 10 in a state in which a display chassis 14 is opened from the main body chassis 12 by a hinge 16 to be in the use form, as viewed from the top.

As illustrated in FIG. 1, the electronic apparatus 10 has a configuration in which the main body chassis (first chassis) 12 and the display chassis (second chassis) 14 are coupled to each other to be pivotable by a pair of right and left hinges 16 provided on adjacent edges of the main body chassis and the display chassis. In the following description of the main body chassis 12, a horizontal direction as viewed by a user is referred to as an X direction, a depth direction is referred to as a Y direction, and a height direction is referred to as a Z direction. A front side and a back side in the Y direction are also referred to as a Y1 side and a Y2 side, respectively.

The main body chassis 12 and the display chassis 14 have a flat and slightly oblong rectangular shape. One hinge 16 having an elongated shape may be provided. A pivoting angle between the main body chassis 12 and the display chassis 14 can take an operation range of, for example, 0 degrees to 130 degrees or 0 degrees to 360 degrees by the function of the hinge 16. The display chassis 14 is provided with a display 18 on a front surface and is covered with a back cover 20 on an opposite side surface. A bezel 22 is provided around the display 18.

The main body chassis 12 has a thin box shape, and includes an upper cover (first cover) 24, a lower cover (second cover) 26, and a frame 52. The frame 52 includes a plate frame 34 and a side wall frame 28. The upper cover 24 and the lower cover 26 are made of a metal material or a resin material. A keyboard 30 and a touch pad 32 are provided at the upper cover 24. In addition, in one or more embodiments, attachment to a built-in frame 52, such as a main board 44, a thermal module 46, a battery 48, and a speaker 50, which will be described below, or attachment in a state where the frame 52 and the upper cover 24 are integrated may be made. These components are attached to not only the upper cover 24 but also the lower cover 26 or the frame 52. A configuration in which many elements are attached to the frame 52, and the upper cover 24 and the lower cover 26 are subsequently assembled may be made. The lower cover 26 covers these components. In a case where the battery 48 is replaced, the replacement is performed by removing the lower cover 26. The access right may be classified into levels in accordance with the specification, such as a case where the replacement work of the battery 48 or the like is permitted by the user or a case where the designated service person performs the replacement work.

An upper surface (one surface) of the main body chassis 12 is formed by the upper cover 24, the keyboard 30, and the touch pad 32. The keyboard 30 is located on the Y2 side, the touch pad 32 is located on the Y1 side, and the keyboard 30 and the touch pad 32 are adjacent to each other. The keyboard 30 extends over substantially the entire width of the upper cover 24 in the X direction.

A rectangular hole 24*a* (see FIG. 4) in which a keyboard 30 is mounted is formed on the Y2 side of the upper cover 24. Fin pieces 24*aa* that support the keyboard 30 are provided on the inner periphery of the rectangular hole 24*a*. The keyboard 30 is fitted into and fixed to the rectangular hole 24*a*, and is attachable to and detachable in an outward direction (upper side in this case) of the chassis. Transmission and reception are performed between the keyboard 30 and the main body chassis 12 by a connector, a pogo pin, or wirelessly.

A lower surface (the other surface) of the main body chassis 12 is formed by the lower cover 26 and the plate frame 34. The lower cover 26 has a wide first portion 26*a* on the Y1 side of the main body chassis 12 and a narrow second portion 26*b* forming an edge on the Y2 side. The plate frame 34 is fitted into an oblong plate frame insertion hole 26*c* formed between the first portion 26*a* and the second portion 26*b*. Both end portions of the first portion 26*a* and the second portion 26*b* are linked by a bridge 26*h* (see FIG. 15). The plate frame 34 is provided over the entire width in the X direction along the long side of the main body chassis 12. A ratio of the Y-direction width between the wide first portion 26*a* and the plate frame 34 is about 1:3 in the present example. Stop blocks 36 and 38 are fitted to both ends of the plate frame 34. Input output (IO) connectors 40 and 42 are provided on the sides of the stop blocks 36 and 38. The IO connectors 40 and 42 are, for example, a universal serial bus (USB) type C, a high-definition multimedia interface (HDMI, registered trademark), or the like, and are used for transmitting and receiving signals and charging. The side wall frame 28, the plate frame 34, and the stop blocks 36 and 38 will be described in more detail later.

Figure 3:
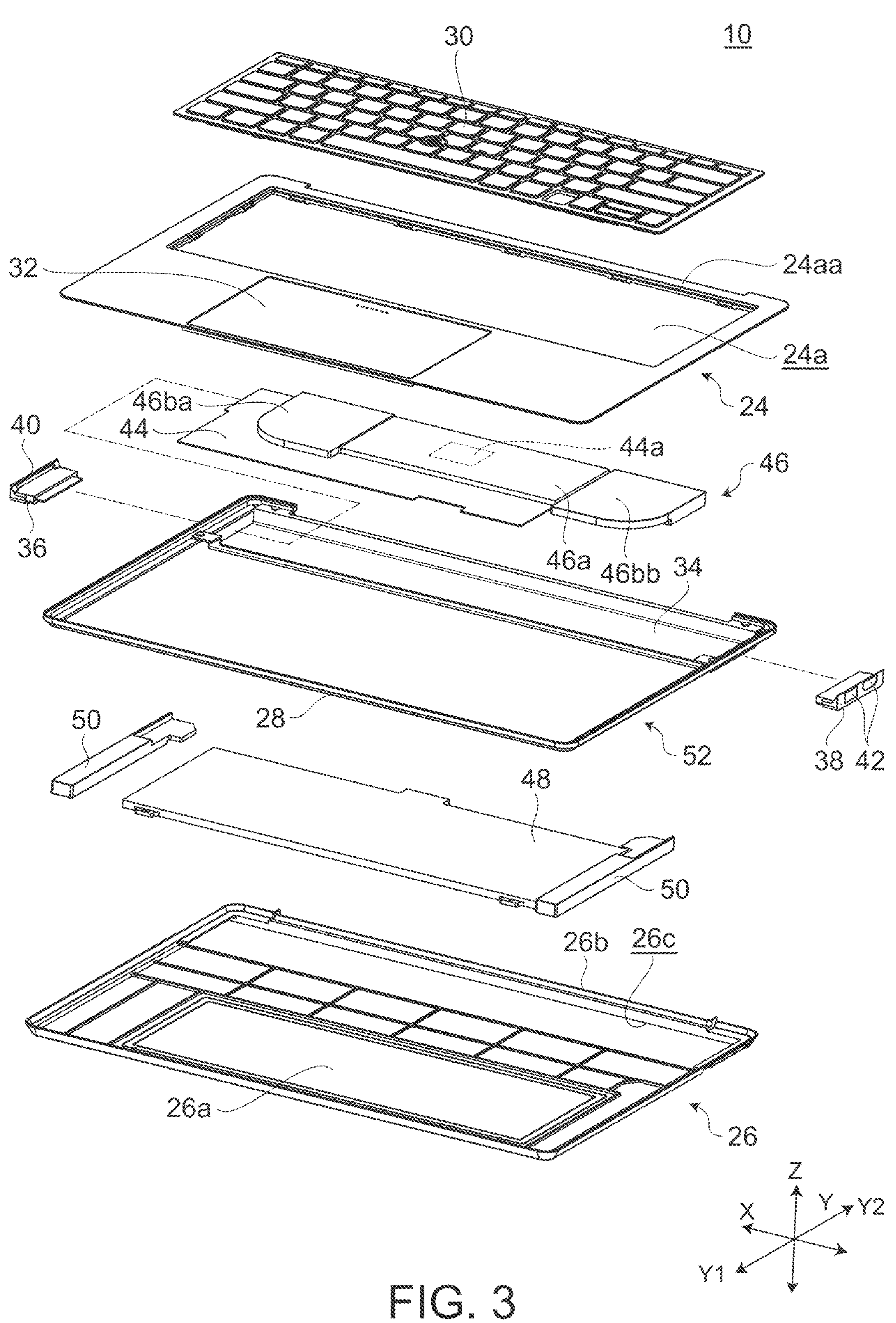
FIG. 3 is an exploded perspective view of the main body chassis.
Figure 4:
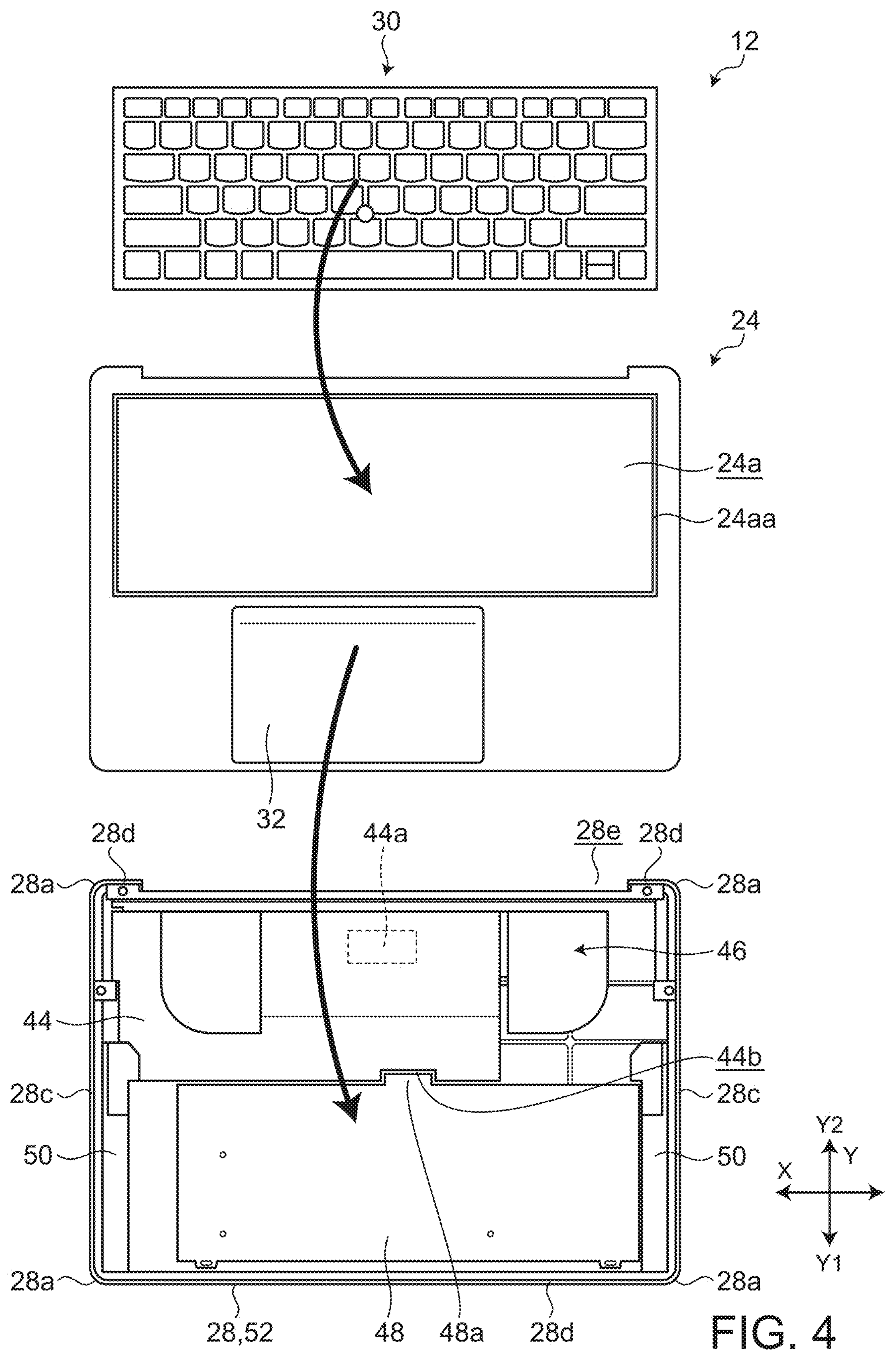
FIG. 4 is an exploded plan view of the main body chassis.
Figure 5:
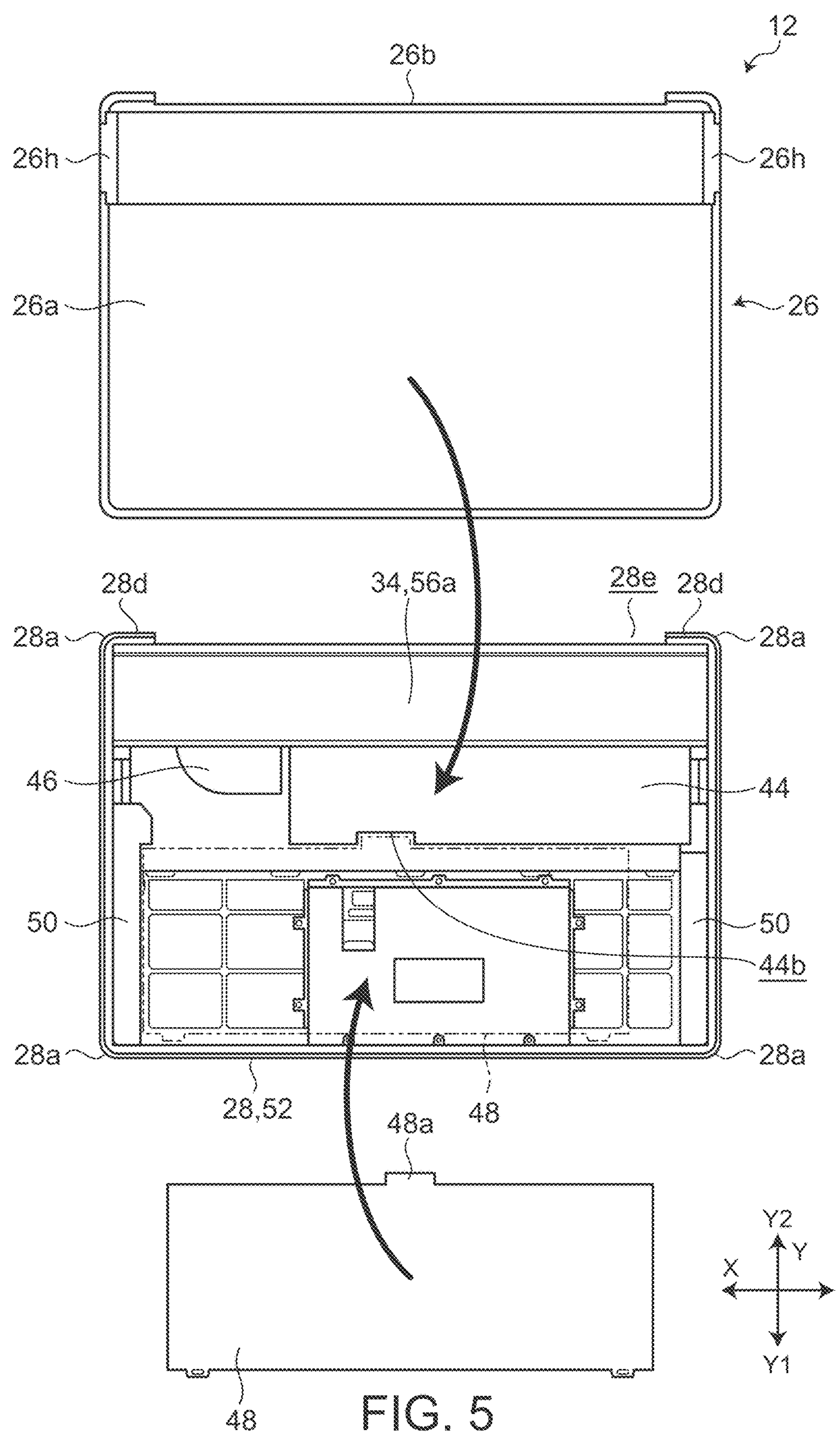
FIG. 5 is an exploded bottom view of the main body chassis.

FIG. 3 is an exploded perspective view of the main body chassis 12. FIG. 4 is an exploded plan view of the main body chassis 12. FIG. 5 is an exploded bottom view of the main body chassis 12. Inside the main body chassis 12, the main board 44, the thermal module 46, the battery 48, and the pair of right and left speakers 50 are provided.

The main board 44 is an oblong rectangle, and a Y2 side thereof is located at a position close to a Y2 side edge of the plate frame 34. The main board 44 is located at a position close to the side wall frame 28 on one side in the X direction (left side in FIGS. 3 and 4) at an edge of the main body chassis 12. The other side (right side in FIGS. 3 and 4) is slightly away from the side wall frame 28. A CPU 44*a* as a main control unit is mounted on the main board 44.

The thermal module 46 includes a heat dissipation plate 46*a* thermally connected to the CPU 44*a*, and fans 46*ba* and 46*bb* provided at both right and left ends of the heat dissipation plate 46*a*. The heat dissipation plate 46*a* is a vapor chamber or the like. In FIG. 3, the left side fan 46*ba* is located at a position overlapping with the main board 44, and the right side fan 46*bb* is located at a position that is adjacent to the main board 44 but does not overlap with the main board 44. The fans 46*ba* and 46*bb* blow air to a heat sink thermally connected to the heat dissipation plate 46*a* to dissipate heat.

The battery 48 is a thin oblong rectangle, and the Y-direction width is slightly shorter than the main body chassis 12, and is located slightly on the right side in FIGS. 3 and 4. The main board 44 and the battery 48 have a Y-direction width that is slightly smaller than the half of the Y-direction width of the main body chassis 12, and are adjacent to each other in the Y direction. A connection protrusion 48*a* that is inserted into and connected to a notch portion 44*b* of the main board 44 is provided at the center of the battery 48 in the X direction. The battery 48 is exposed by removing the lower cover 26, and can be replaced or repaired. The battery 48 is, for example, a lithium ion type. The pair of speakers 50 each have an elongated shape in the Y direction, and are provided at positions along the Y direction and on the Y1 side at both right and left ends of the main body chassis 12.

Figure 6:
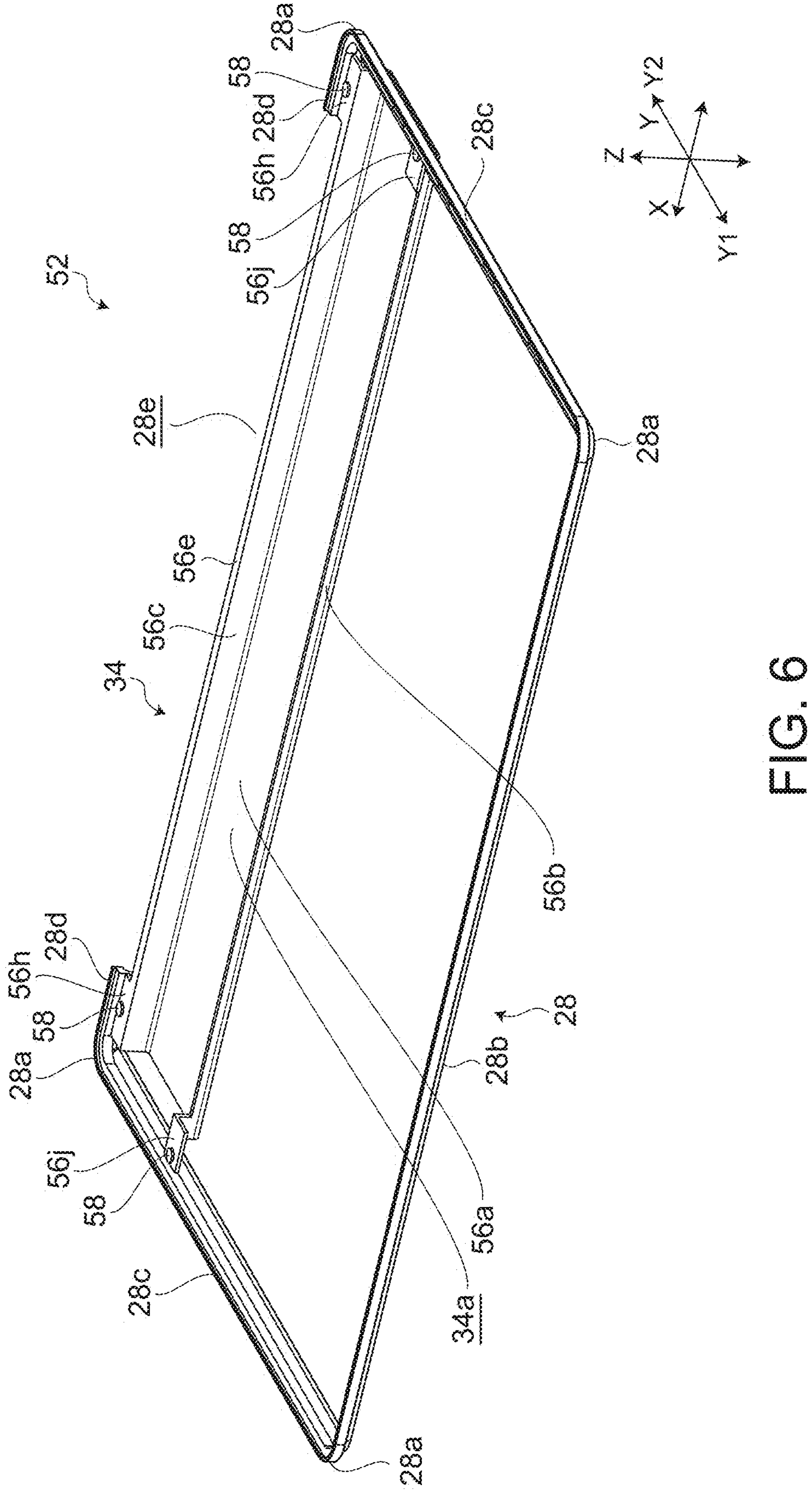
FIG. 6 is a perspective view of a frame.
Figure 7:
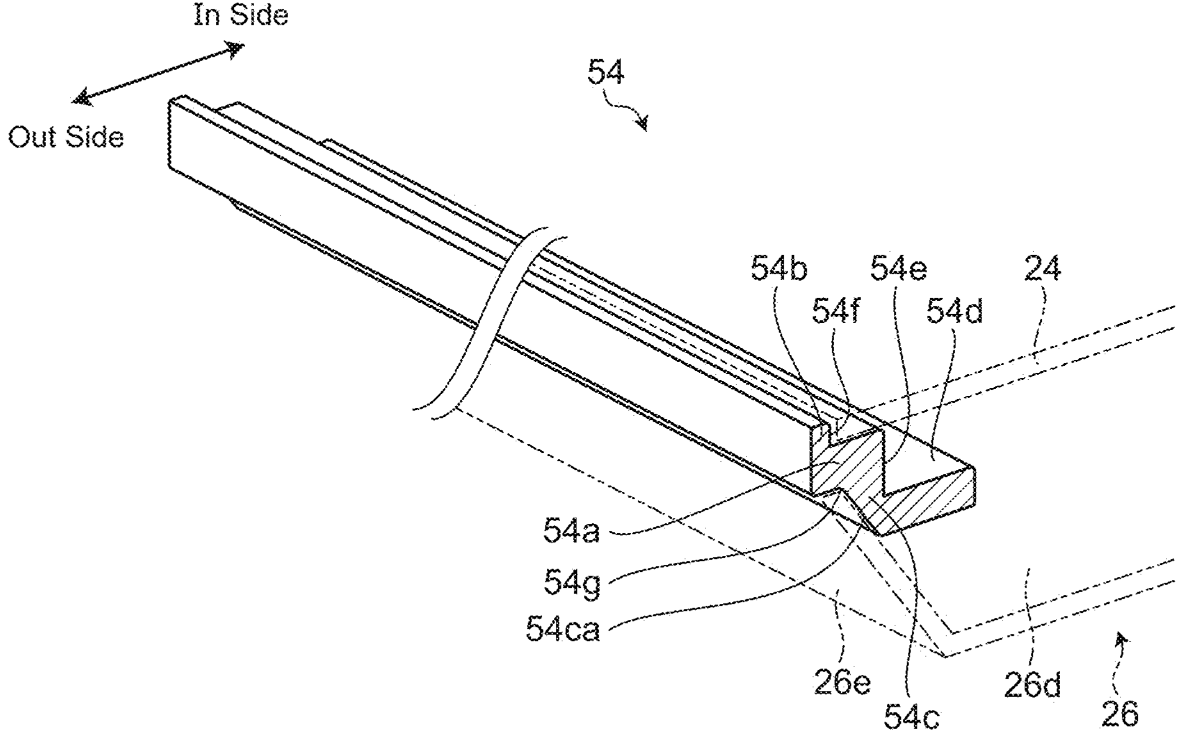
FIG. 7 is a perspective view of an extruded material as a material of a side wall frame.
Figure 8:
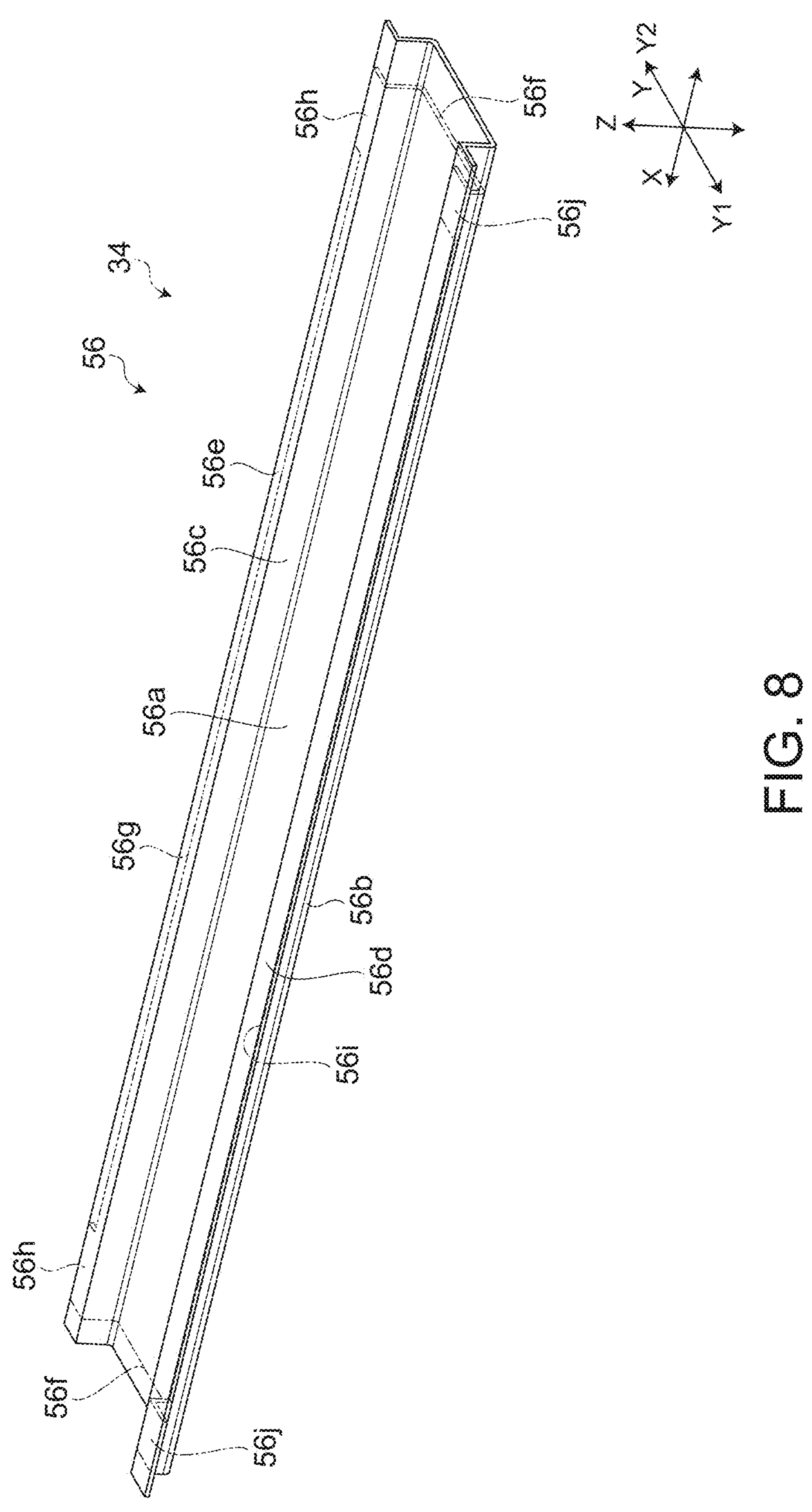
FIG. 8 is a perspective view of an extruded material as a material of a plate frame.
Figure 9:
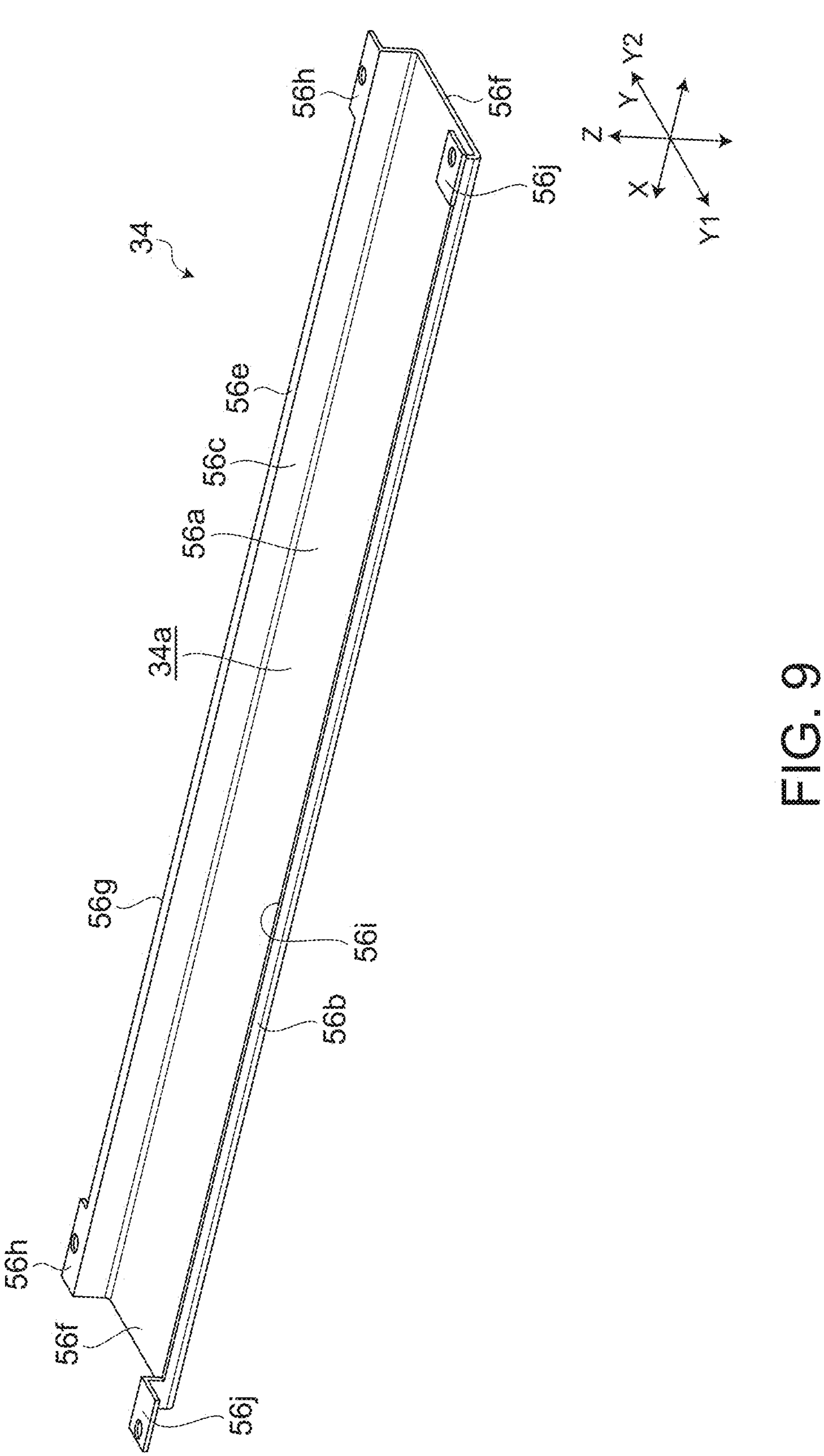
FIG. 9 is a perspective view of the plate frame.

FIG. 6 is a perspective view of the frame 52. The frame 52 is configured by the side wall frame 28 and the plate frame 34. FIG. 7 is a perspective view of an extruded material 54 as a material of the side wall frame 28. FIG. 8 is a perspective view of an extruded material 56 as a material of the plate frame 34. FIG. 9 is a perspective view of the plate frame 34.

The extruded materials 54 and 56 are basically metal materials such as an aluminum alloy, and are obtained by extrusion molding. That is, the extruded materials 54 and 56 are obtained by pushing a billet inserted into a container into a die having a predetermined cross-sectional shape, and have the same cross section along an elongated direction. In the extrusion molding, the extruded materials 54 and 56 can be formed with high material efficiency (for example, about 90%). The material efficiency is very high as compared with a case where the cover in the unibody design is formed by CNC processing or by molding, which contributes to reduction of an environmental load and cost suppression. Various well-known technologies can be applied to the extrusion molding of the extruded materials 54 and 56, and the detailed description thereof will be omitted in the present application.

In FIG. 7, one of directions perpendicular to the elongated direction of the extruded material 54 and the Z direction is referred to as an inner side of a frame (In Side), and the other side is referred to as an outer side of the frame (Out Side). The inner side of the frame is a direction that is an inner side of a C-shape when the side wall frame 28 having a quadrangular C-shape is obtained by processing the extruded material 54, and the outer side of the frame is an opposite side thereof. In FIG. 7, the upper cover 24 and the lower cover 26 are illustrated by imaginary lines.

The extruded material 54 includes a base portion 54*a*, an upper protruding portion 54*b*, a lower protruding portion 54*c*, and an inward projecting portion 54*d*. The base portion 54*a* has a rectangular cross section having a slightly wide width in an inner side-outer side direction of the frame. The upper protruding portion 54*b* has a rectangular cross section and protrudes upward from the end portion of the base portion 54*a* on the outer side of the frame. The lower protruding portion 54*c* has a triangular cross section having an inclined surface 54*ca* and protrudes downward from the base portion 54*a*. The lower protruding portion 54*c* and the base portion 54*a* coincide with each other to form a frame inner-side surface 54*e*. The inclined surface 54*ca* is inclined to be closer to the inside of the frame downward from the lower surface of the base portion 54*a*. The inward projecting portion 54*d* protrudes from the lower portion of the lower protruding portion 54*c* toward the inner side of the frame. The inward projecting portion 54*d* is a portion that serves as a fixing seat for fixing the plate frame 34, and has a width and a thickness suitable for the fixing.

The height of the upper protruding portion 54*b* is substantially equal to the thickness of the upper cover 24. The upper cover 24 is placed on an upper surface of the base portion 54*a* and is positioned by an upper inner corner portion (first inner corner portion) 54*f* formed by the base portion 54*a* and the upper protruding portion 54*b*. The upper inner corner portion 54*f* positions the edge of the upper cover 24 from the outer side of the frame.

A lower surface of the base portion 54*a*, which is located on the outer side of the frame, is substantially equal to the thickness of the lower cover 26, as compared with the inclined surface 54*ca*. The lower cover 26 includes a bottom plate 26*d* that occupies a major portion of the area, and an inclined plate 26*e* that is formed around the bottom plate 26*d*. The side portion of the main body chassis 12 is made to have a suitable design by making the side portion of the main body chassis 12 appear to be thin by the inclined plate 26*e*. The inclined plate 26*e* is inclined to be closer to the outer side of the frame upward. The inclined surface 54*ca* and the inclined plate 26*e* have the same inclination angle. In the lower cover 26, the inclined plate 26*e* is in contact with the inclined surface 54*ca*, and the end portion is positioned by a lower inner corner portion (second inner corner portion) 54*g* formed by the base portion 54*a* and the inclined surface 54*ca*. The lower inner corner portion 54*g* positions the edge of the lower cover 26 from the inner side of the frame.

As illustrated in FIG. 6, the side wall frame 28 is formed by cutting the extruded material 54 to a predetermined length and forming a quadrangular C-shape by bending the extruded material 54 at four bent portions 28*a* at 90 degrees by the side wall 28*b* on the Y1 side, the side walls 28*c* on the right and left sides, and the short side walls 28*d* on the right and left sides on the Y2 side. Since the main body chassis 12 has an oblong shape, the side wall 28*b* is longer than the side wall 28*c*. An outer side of the frame of the bent portion 28*a* is arc-shaped. A notch 54*da* (see FIG. 15) or the like may be formed in the inward projecting portion 54*d* on the inner side of the frame of the bent portion 28*a* for bending. Heat treatment or the like may be performed during the formation of the bent portion 28*a*. In the present example, the lengths of the two side walls 28*d* on the Y2 side are about 1/10 of the length of the side wall 28*b* on the Y1 side. A portion between the two side walls 28*d* is an opening portion 28*e* of a quadrangular C-shape formed by the side wall frame 28. That is, the right and left side walls 28*d* form both end portions of the opening portion 28*e*. The hinge 16 (see FIG. 1) is disposed in the opening portion 28*e*.

As illustrated in FIG. 8, the extruded material 56 includes a plate-shaped portion 56*a*, a front partition wall 56*b*, a rear partition wall 56*c*, a front projecting portion 56*d*, and a rear projecting portion 56*e*. The plate-shaped portion 56*a* is a main portion of the extruded material 56 and has a width that is moderately wide in the Y direction. The plate-shaped portion 56*a* does not necessarily have a planar shape, and may be, for example, a wave plate shape having a plurality of uneven portions provided along the X direction. The plate-shaped portion 56*a* may have a portion having a different thickness depending on the Y direction position. The front partition wall 56*b* and the rear partition wall 56*c* are low and are erected upward from the Y1-side and Y2-side end portions of the plate-shaped portion 56*a*. In this case, an angle between the front partition wall 56*b* and the rear partition wall 56*c*, and the plate-shaped portion 56*a* is 90 degrees. The front projecting portion 56*d* projects short from the upper end of the front partition wall 56*b* to the Y1 side. The rear projecting portion 56*e* projects short from the upper end of the rear partition wall 56*c* to the Y2 side.

In the present example, each portion of the extruded material 56 may have the same thickness, and may be formed by bending a metal plate. Since the extruded material 56 is an extrusion molded product, each portion can be made to have a different thickness depending on the design conditions. In the present example, the front partition wall 56*b* and the rear partition wall 56*c* have the same shape, and the front projecting portion 56*d* and the rear projecting portion 56*e* have the same shape. Therefore, the extruded material 56 has a front-rear symmetrical shape, but may be front-rear asymmetrical depending on the design conditions (see FIG. 12(A) and the like). The plate frame 34 is formed by cutting out the extruded material 56 into a predetermined length and then cutting out an imaginary line portion in FIG. 8.

In the plate-shaped portion 56*a* and the rear partition wall 56*c* in the plate frame 34, both end portions 56*f* in FIG. 8 are cut out, and the Y-direction length is equal to a distance between the right and left side walls 28*c* (see FIG. 6) in the side wall frame 28.

In FIG. 8, both end portions of the rear projecting portion 56*e* remain, the rear projecting portion is cut out by a rear notch 56*g* with most of the Y-direction width, and both the end portions that are not cut out form a first outward projecting portion 56*h*. The Y-direction width of the first outward projecting portion 56*h* is the same as that of the inward projecting portion 54*d*. In addition, the X-direction width of the first outward projecting portion 56*h* is substantially the same as the length of the side wall 28*d* on the rear side of the side wall frame 28, and a space in which the hinge 16 is disposed is secured.

The front partition wall 56*b* and the front projecting portion 56*d* in FIG. 8 are cut out at a front notch 56*i*, and both end portions of the front projecting portion 56*d*, which are not cut out, form a second outward projecting portion 56*j*. The second outward projecting portion 56*j* is a portion that is not cut out at both the end portions 56*f* and that protrudes relatively to the outer side of the frame. The protruding length of the second outward projecting portion 56*j*, that is, a notch depth of both the end portions 56*f* is the same as the inward projecting portion 54*d*. An X-direction total length of the second outward projecting portion 56*j* is short enough to be connected to the plate-shaped portion 56*a*.

The entirety of the front projecting portions 56*d* other than the second outward projecting portion 56*j* are cut out by the front notches 56*i*. The front partition wall 56*b* is cut out to have a height of about the half of the height by the front notch 561. The main board 44 and the like can be disposed to straddle the front partition wall 56*b* by suppressing the front partition wall 56*b* to be low.

The plate frame 34 is strong against twisting in the XY plane because the plate-shaped portion 56*a* has a moderate width in the Y direction. The plate frame 34 has a large cross-sectional second moment because the front partition wall 56*b* and the rear partition wall 56*c* are formed at both ends of the plate-shaped portion 56*a* in the Y direction to have a flat U-shape, and is strong in bending in the XZ plane. In a case where the side wall frame 28 has a sufficient strength alone, the plate frame 34 may be omitted.

The plate frame 34 may include three or more partition walls. The plate frame 34 forms a space 34*a* surrounded on three sides by a flat U-shape formed by the plate-shaped portion 56*a*, the front partition wall 56*b*, and the rear partition wall 56*c*. At least the CPU 44*a* of the main board 44 is provided in the space 34*a*.

As illustrated in FIG. 6, the plate frame 34 is fixed by the screws 58 at a total of four locations, where the first outward projecting portions 56*h* at both ends are placed on the upper surfaces of the inward projecting portions 54*d* of the side walls 28*d*, and the second outward projecting portions 56*j* at both ends are placed on the upper surfaces of the inward projecting portions 54*d* of the side walls 28*c*. The fixing between the first outward projecting portion 56*h* and the second outward projecting portion 56*j* and the inward projecting portion 54*d* is not limited to a screw 58, and may be welding, depositing, bonding, or the like. The first outward projecting portion 56*h* and the second outward projecting portion 56*j* may be fixed to the lower surface of the inward projecting portion 54*d*.

As described above, the plate frame 34 is connected between the side walls 28*d*, which are both end portions of the opening portion 28*e* having a quadrangular C-shape in the side wall frame 28, to reinforce the side wall 28*d*, and the entirety of the frame 52 has a frame shape in which four sides are closed. The plate frame 34 is provided between the side walls 28*c* facing each other on the right and left in the side wall frame 28, and the distance between the two side walls 28*c* is properly maintained.

The side wall frame 28 forms three edges of the main body chassis 12 by the side walls 28*b*, 28*c*, and 28*c*, and forms a part of one edge where a pair of side walls 28*d* remain, but the side walls 28*d* may be omitted depending on the design conditions. That is, the side wall frame 28 need only have at least three side walls 28*b*, 28*c*, and 28*c*. In this case, the plate frame 34 may form the one remaining edge. In addition, all four fixed portions of the plate frame 34 with respect to the side wall frame 28 may be the inward projecting portion 54*d* on the side wall 28*c*.

Figures 10A, 10B:
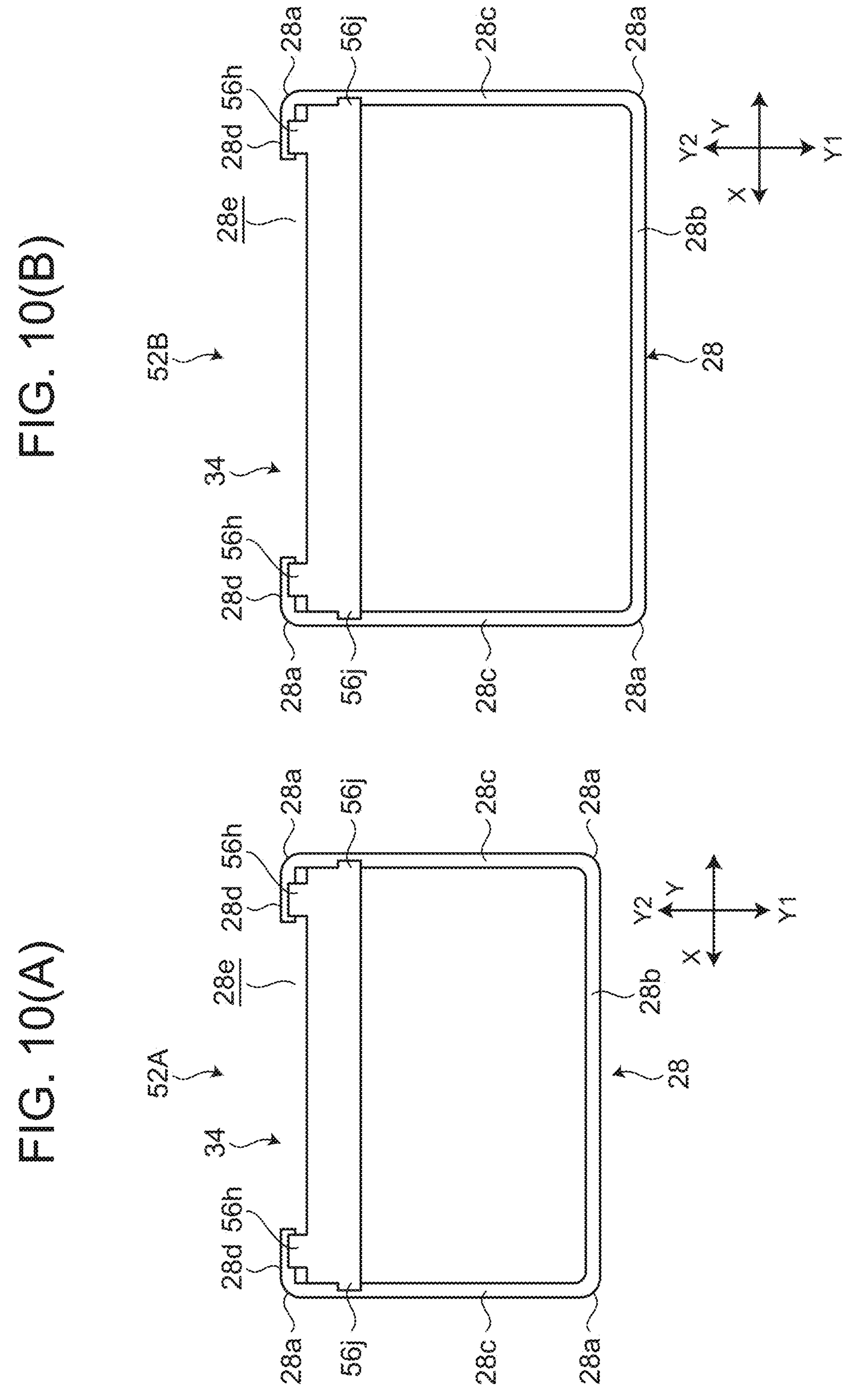
FIGS. 10(A)-(B) are views illustrating an example of difference in size of the frame, in which 10(A) illustrates a small frame and 10(B) illustrates a large frame.

FIGS. 10(A)-(B) are views illustrating an example of difference in size of the frame 52, in which 10(A) illustrates a small frame 52A and 10(B) illustrates a large frame 52A. In the electronic apparatus 10, the size of the main body chassis 12 may vary depending on the specification. In a case in which the main body chassis 12 is small, the frame 52A is applied in accordance with the size thereof, and in a case in which the main body chassis 12 is large, the frame 52B is applied in accordance with the size thereof. The side wall frames 28 in the frames 52A and 52B each use an extruded material 54 (see FIG. 7), and are applicable by changing the lengths of the side walls 28*b*, 28*c*, and 28*d* according to the position of the bent portion 28*a*. Each of the plate frames 34 in the frames 52A and 52B uses an extruded material 56 (see FIG. 8), and are applicable by changing the X-direction length.

FIGS. 11(A)-(D) are views illustrating modification examples of the extruded material 54, in which 11(A) is a perspective view of an extruded material 54A according to a first modification example, 11(B) is a perspective view of an extruded material 54B according to a second modification example, 11(C) is a perspective view of an extruded material 54C according to a third modification example, and 11(D) is a perspective view of an extruded material 54D according to a fourth modification example. FIG. 11(E) is a partially cross-sectional perspective view of an extruded material 54E according to a fifth modification example and a lower cover 26 corresponding to the extruded material. The same reference numerals are assigned to the similar components as those of the extruded material 54 in each modification example, and detailed description thereof will be omitted. In FIGS. 11(A)-(D), the upper cover 24 and the lower cover 26 are illustrated by imaginary lines.

Figures 11A, 11B, 11C, 11D:
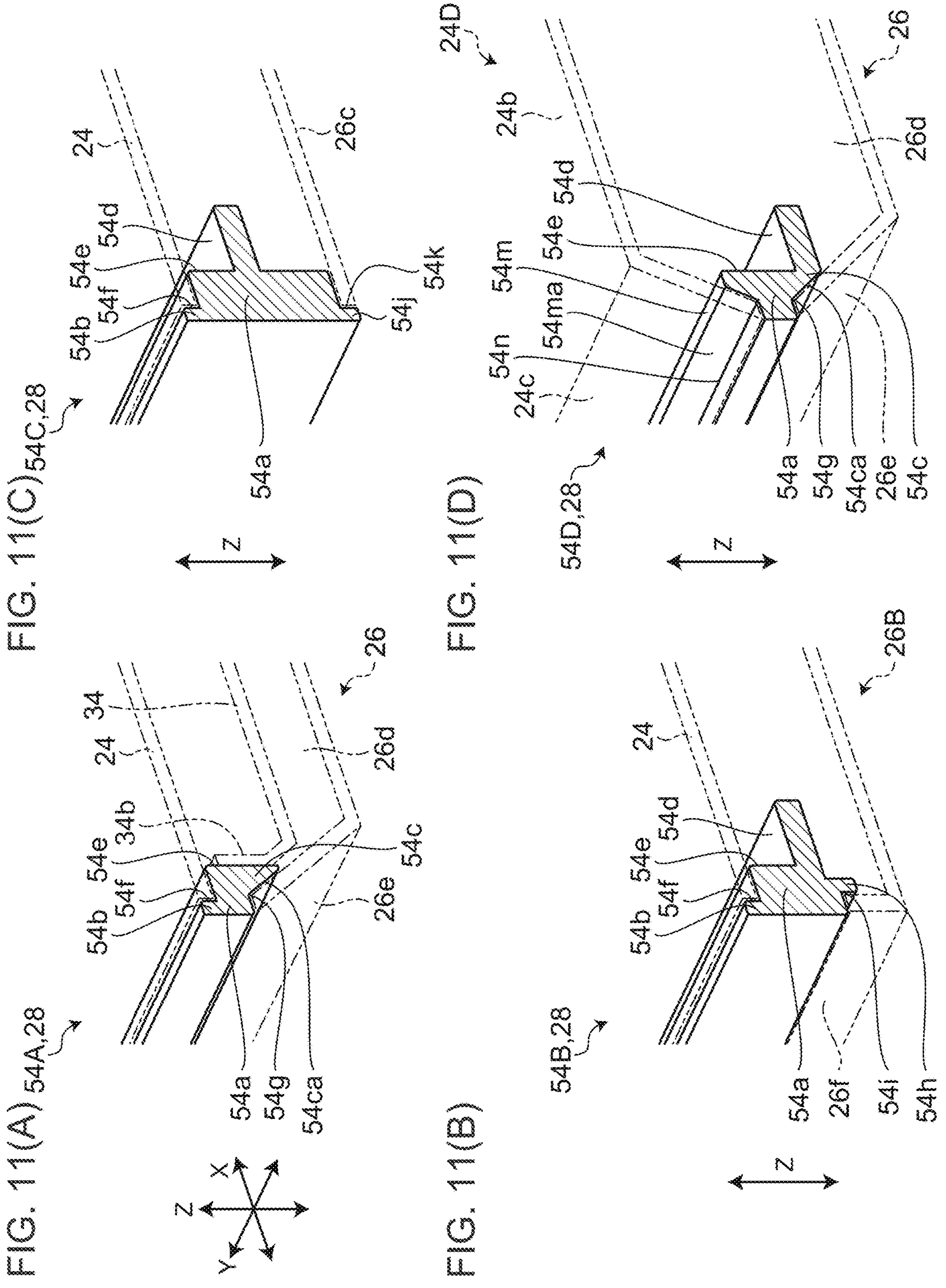
FIGS. 11(A)-(D) are views illustrating modification examples of the extruded material, in which 11(A) is a perspective view of an extruded material according to a first modification example, 11(B) is a perspective view of an extruded material according to a second modification example, 11(C) is a perspective view of an extruded material according to a third modification example, and 11(D) is a perspective view of an extruded material according to a fourth modification example.
Figure 11E:
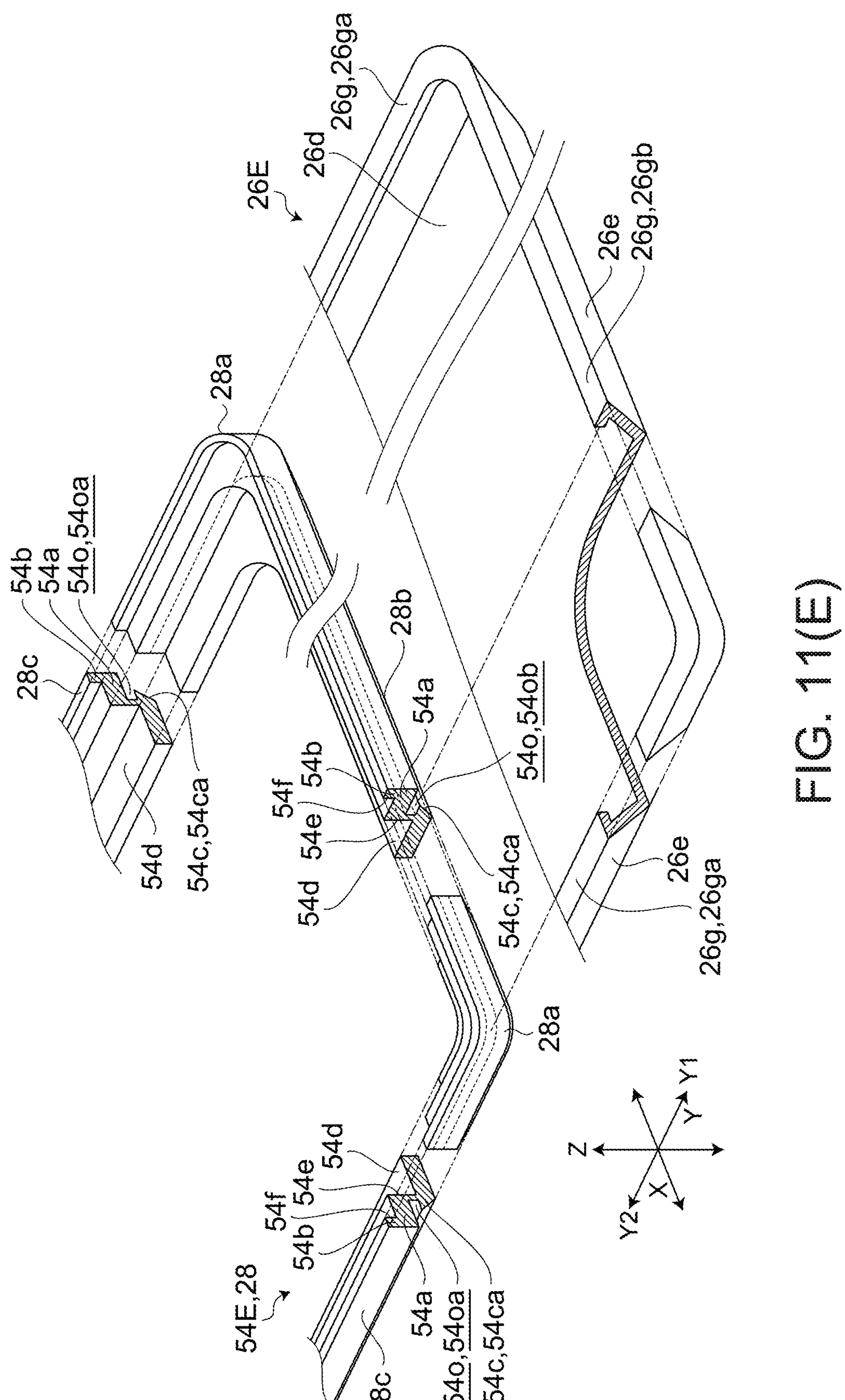
FIG. 11(E) is a partially cross-sectional perspective view of an extruded material according to a fifth modification example and a lower cover corresponding to the extruded material.

The extruded material 54A illustrated in FIG. 11(A) is obtained by omitting the inward projecting portion 54*d* from the extruded material 54 described above (see FIG. 7). The inward projecting portion 54*d* is basically provided for fixing the plate frame 34, and may be omitted in a case where there is another fixing unit of the plate frame 34. The extruded material 54A in which the inward projecting portion 54*d* is omitted is likely to form the bent portion 28*a*. In the plate frame 34 in this case, upward fin pieces 34*b* may be provided at both ends in the X direction and fixed to the frame inner-side surface 54*e*.

The extruded material 54B illustrated in FIG. 11(B) is obtained by providing a lower protruding portion 54*h* instead of the inclined lower protruding portion 54*c* in the extruded material 54 (see FIG. 7). The lower protruding portion 54*h* has the same shape as the upper protruding portion 54*b*, and is provided downward and slightly inside the frame with respect to the upper protruding portion 54*b*. A lower inner corner portion 54*i* is formed by the lower surface of the base portion 54*a* and the lower projection portion 54*h*. In this case, a vertical erection plate 26*f* may be provided on the lower cover 26B instead of the inclined plate 26*e*, and the edge of the vertical erection plate 26*f* may be positioned from the inner side of the frame by the lower inner corner portion 54*i*.

The extruded material 54C illustrated in FIG. 11(C) is obtained by providing a lower protruding portion 54*j* instead of the inclined lower protruding portion 54*c* in the extruded material 54 (see FIG. 7). The lower protruding portion 54*j* protrudes downward from the outer-side end portion of the frame of the base portion 54*a*, similar to the upper protruding portion 54*b*. The lower protruding portion 54*j* may have the same shape as the upper protruding portion 54*b*. A lower inner corner portion 54*k* is formed by the lower surface of the base portion 54*a* and the lower protruding portion 54*j*. In this case, the inclined plate 26*e* is not provided on the lower cover 26C, and the edge portion may be positioned from the outer side of the frame by the lower inner corner portion 54*k*.

The extruded material 54D illustrated in FIG. 11(D) is obtained by providing an upper protruding portion 54*m* instead of the upper protruding portion 54*b* in the extruded material 54 (see FIG. 7). The upper protruding portion 54*m* has a shape that is symmetrical up and down with the lower protruding portion 54*c* and has an inclined surface 54*ma*. An upper inner corner portion 54*n* is formed by the upper surface of the base portion 54*a* and the inclined surface 54*ma*. The upper cover 24D in this case includes a top plate 24*b* that occupies a major portion of the area and an inclined plate 24*c* that is formed around the top plate 24*b*. The inclined surface 54*ma* and the inclined plate 24*c* have the same inclination angle. The upper inner corner portion 54*n* positions the edge of the inclined plate 24*c* from the inner side of the frame.

The extruded material 54E illustrated in FIG. 11(E) has a groove 540 on the side with respect to the extruded material 54 (see FIG. 7). The groove 540 is formed in a form in which the lower surface of the base portion 54*a* is extended to the inner side of the frame at the upper portion of the lower protruding portion 54*c*, and is open to the outer side of the frame.

In the side wall frame 28 obtained by bending the extruded material 54E, grooves 540 are formed in the right and left side walls 28*c* to form slide grooves 540*a*, and engagement grooves 54*ob* are formed in the side wall 28*b* located at the center on the Y1 side as viewed from the right and left side walls 28*c*. The slide groove 60*a* and the engagement groove 60*b* are continuous with each other because the slide groove 60*a* and the engagement groove 60*b* are formed by the same groove 540. The lower cover 26E in this case includes a bottom plate 26*d*, an inclined plate 26*e*, and an inward protrusion 26*g*. The inward protrusion 26*g* protrudes short from the upper end of the inclined plate 26*e* toward the inner side of the frame. A slide protrusion 26*ga* provided at both right and left ends of the lower cover 26 in the inward protrusion 26*g* is engaged with the slide groove 540*a* to be slidable. An engagement protrusion 26*gb* on the Y1 side of the lower cover 26 in the inward protrusion 26*g* engages with the engagement groove 54*ob*.

FIGS. 12(A)-(L) are views illustrating modification examples of the plate frame 34, in which 12(A) is a schematic cross-sectional view of a plate frame 34A according to a first modification example, 12(B) is a schematic cross-sectional view of a plate frame 34B according to a second modification example, 12(C) is a schematic cross-sectional view of a plate frame 34C according to a third modification example, 12(D) is a schematic cross-sectional view of a plate frame 34D according to a fourth modification example, 12(E) is a schematic cross-sectional view of a plate frame 34E according to a fifth modification example, 12(F) is a schematic cross-sectional view of a plate frame 34F according to a sixth modification example, 12(G) is a schematic cross-sectional view of a plate frame 34G according to a seventh modification example, 12(H) is a schematic cross-sectional view of a plate frame 34H according to an eighth modification example, 12(I) is a schematic cross-sectional view of a plate frame 34I according to a ninth modification example, 12(J) is a schematic cross-sectional view of a plate frame 34J according to a tenth modification example, 12(K) is a schematic cross-sectional view of a plate frame 34K according to an eleventh modification example, and 12(L) is a schematic cross-sectional view of a plate frame 34L according to a twelfth modification example. Each modification example is an extruded material.

Figures 12A, 12B, 12C, 12D, 12E, 12F, 12G, 12H, 12I, 12J, 12K, 12L:
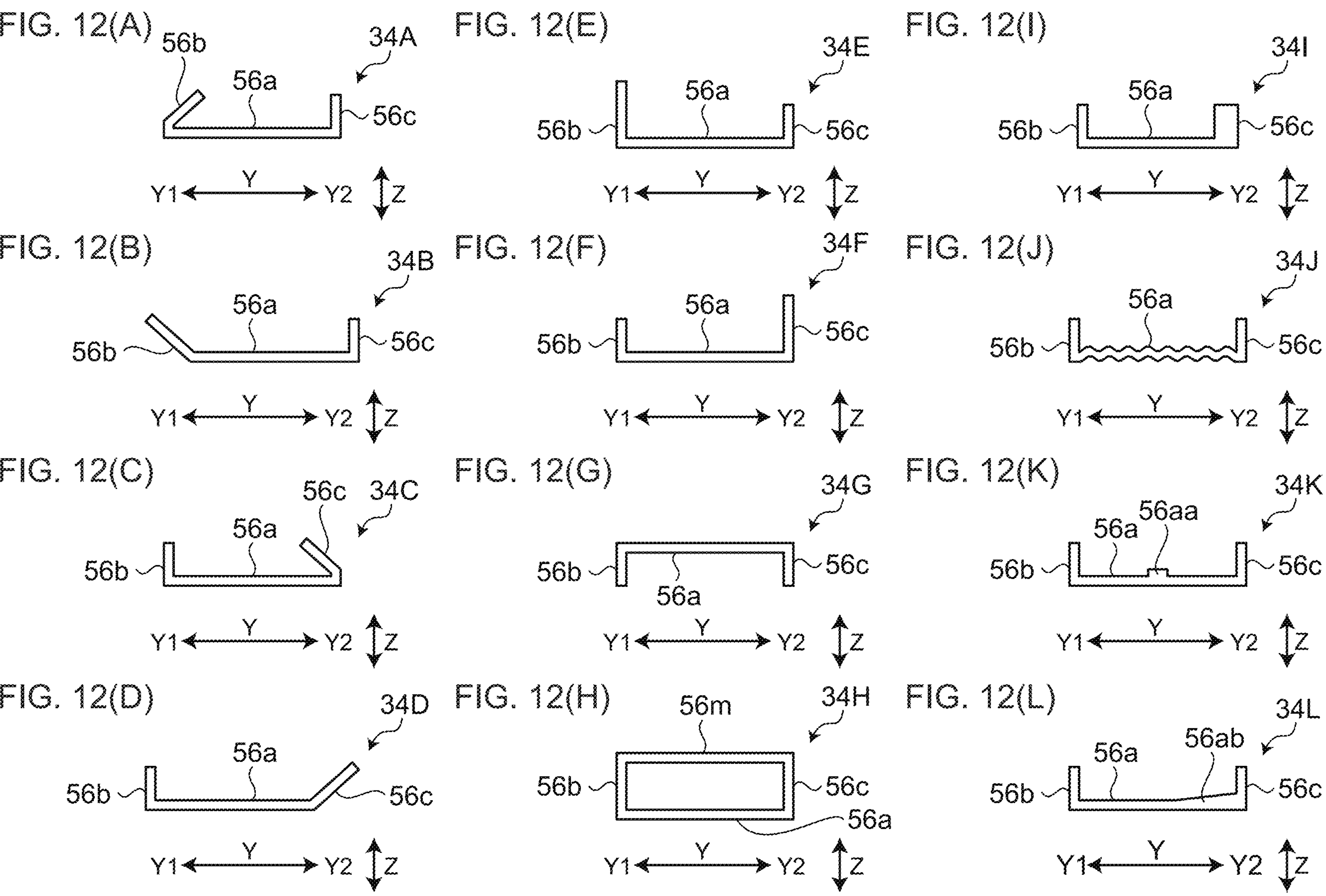
FIGS. 12(A)-(L) are views illustrating modification examples of the plate frame, in which 12(A) is a schematic cross-sectional view of a plate frame according to a first modification example, 12(B) is a schematic cross-sectional view of a plate frame according to a second modification example, 12(C) is a schematic cross-sectional view of a plate frame according to a third modification example, 12(D) is a schematic cross-sectional view of a plate frame according to a fourth modification example, 12(E) is a schematic cross-sectional view of a plate frame according to a fifth modification example, 12(F) is a schematic cross-sectional view of a plate frame according to a sixth modification example, 12(G) is a schematic cross-sectional view of a plate frame according to a seventh modification example, 12(H) is a schematic cross-sectional view of a plate frame according to an eighth modification example, 12(I) is a schematic cross-sectional view of a plate frame according to a ninth modification example, 12(J) is a schematic cross-sectional view of a plate frame according to a tenth modification example, 12(K) is a schematic cross-sectional view of a plate frame according to an eleventh modification example, and 12(L) is a schematic cross-sectional view of a plate frame according to a twelfth modification example.

In the plate frame 34A illustrated in FIG. 12(A), the front partition wall 56*b* is inclined to the Y2 side. In the plate frame 34B illustrated in FIG. 12(B), the front partition wall 56*b* is inclined to the Y1 side. In the plate frame 34C illustrated in FIG. 12(C), the rear partition wall 56*c* is inclined to the Y1 side. In the plate frame 34D illustrated in FIG. 12(D), the rear partition wall 56*c* is inclined to the Y2 side. As described above, the front partition wall 56*b* and the rear partition wall 56*c* need not be perpendicular to the plate-shaped portion 56*a*, and only need to intersect each other.

In the plate frame 34E illustrated in FIG. 12(E), the front partition wall 56*b* is higher than the rear partition wall 56*c*. In the plate frame 34F illustrated in FIG. 12(F), the rear partition wall 56*c* is higher than the front partition wall 56*b*. As described above, the front partition wall 56*b* and the rear partition wall 56*c* may have different heights. The front partition wall 56*b* and the rear partition wall 56*c* may have the same height.

The plate frame 34G illustrated in FIG. 12(G) has a form in which the plate-shaped portion 56*a* connects the upper end portions of the front partition wall 56*b* and the rear partition wall 56*c* and is open downward. In this case, the opening portion of the plate frame 34G may be closed by the lower cover 26. The plate frame 34H illustrated in FIG. 12(H) connects the upper end portions of the front partition wall 56*b* and the rear partition wall 56*c* with the top plate 56*m*, and the plate-shaped portion 56*a*, the front partition wall 56*b*, the rear partition wall 56*c*, and the top plate 56*m* have a closed frame shape.

In the plate frame 34I illustrated in FIG. 12(I), the rear partition wall 56*c* is thicker than the front partition wall 56*b*.

As described above, the front partition wall 56*b* and the rear partition wall 56*c* may have different thicknesses. In the plate frame 34J illustrated in FIG. 12(J), the plate-shaped portion 56*a* has a waveform shape. In the plate-shaped portion 56*a*, one of the upper surface and the lower surface may have a waveform shape and the other may be planar.

In the plate frame 34K illustrated in FIG. 12(K), a protrusion 56*aa* is provided on one surface of the plate-shaped portion 56*a*. The plate frame 34L illustrated in FIG. 12(L) forms an inclined portion 56*ab* such that the plate-shaped portion 56*a* becomes thicker from the center toward the Y2 side. As described above, the thickness of the plate-shaped portion 56*a* need not be constant.

FIGS. 13(A)-(D) are views illustrating modification examples of the main body chassis 12, in which 13(A) is a schematic cross-sectional view of a main body chassis 12A according to a first modification example, 13(B) is a schematic cross-sectional view of a main body chassis 12B according to a second modification example, 13(C) is a schematic cross-sectional view of a main body chassis 12C according to a third modification example, and 13(D) is a schematic cross-sectional view of a main body chassis 12D according to a fourth modification example.

Figure 13A:
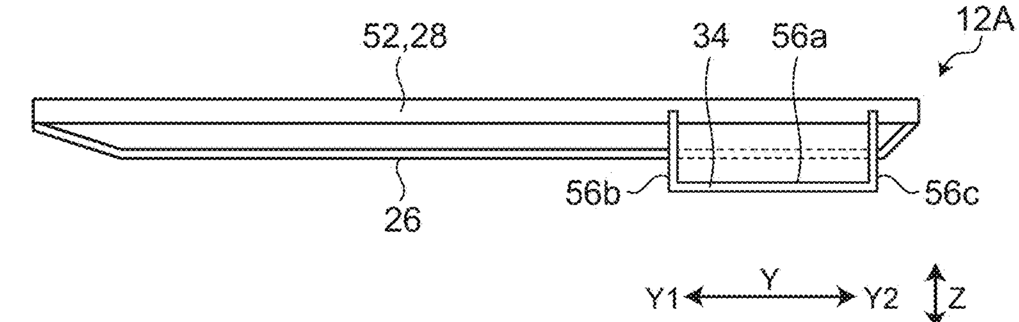
FIG. 13(A)-(D) are views illustrating modification examples of the main body chassis, in which 13(A) is a schematic cross-sectional view of a main body chassis according to a first modification example, 13(B) is a schematic cross-sectional view of a main body chassis according to a second modification example, 13(C) is a schematic cross-sectional view of a main body chassis according to a third modification example, and 13(D) is a schematic cross-sectional view of a main body chassis according to a fourth modification example.
Figure 13B:
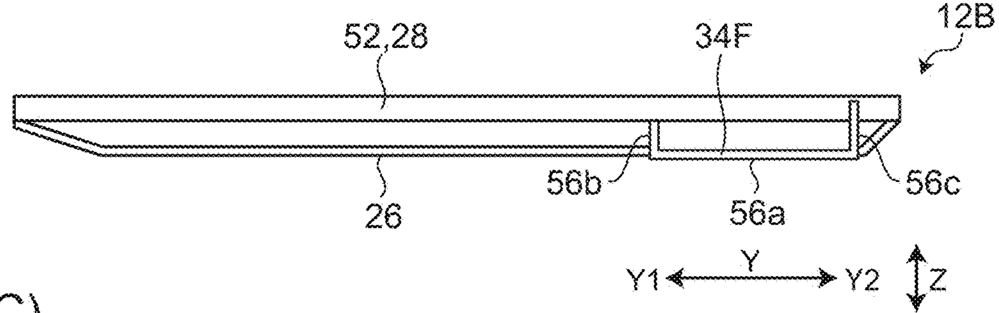
Figure 13C:
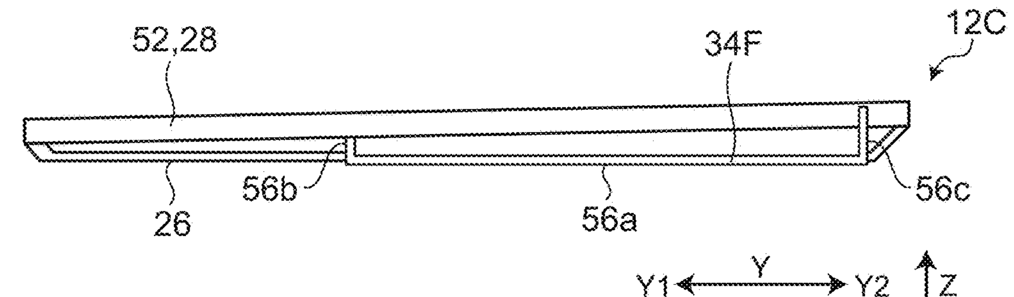
Figure 13D:
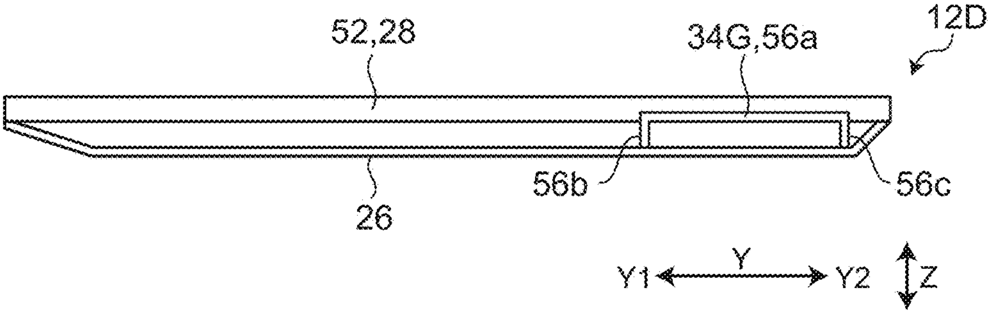

In the main body chassis 12A illustrated in FIG. 13(A), the front partition wall 56*b* and the rear partition wall 56*c* of the plate frame 34 are slightly higher, and the plate-shaped portion 56*a* slightly protrudes from the lower cover 26. As described above, the plate-shaped portion 56*a* and the lower cover 26 need not be in the same plane shape. The main body chassis 12B illustrated in FIG. 13(B) is applied with the above-described plate frame 34F (see FIG. 12(F)), and the attachment height of the front partition wall 56*b* and the rear partition wall 56*c* to the side wall frame 28 is different. The main body chassis 12C illustrated in FIG. 13(C) is applied with the above-described plate frame 34F (see FIG. 12(F)), but the Y-dimension of the plate-shaped portion 56*a* is longer. As described above, the Y-dimension of the plate frame is not particularly limited. In addition, the main body chassis 12C is inclined such that the side wall frame 28 is lowered toward the Y1 side. Although not illustrated, the upper cover 24 is also inclined in the similar manner, and thus the typing on the keyboard 30 is facilitated. The main body chassis 12D illustrated in FIG. 13(D) is applied with the above-described plate frame 34G (see FIG. 12(G)), and the lower cover 26 closes the lower opening portion of the plate frame 34G.

Figure 14:
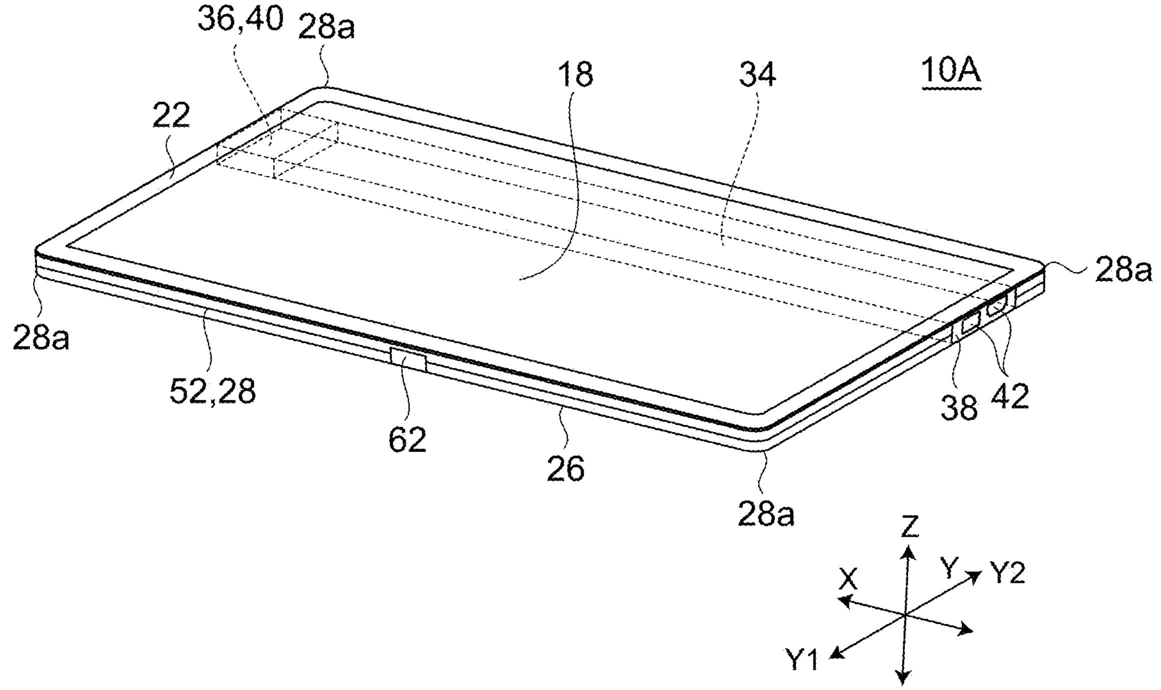
FIG. 14 is a perspective view of a tablet-type electronic apparatus according to a modification example.

FIG. 14 is a perspective view of an electronic apparatus 10A according to a modification example of the electronic apparatus 10. The electronic apparatus 10A is a tablet type. The electronic apparatus 10A includes a frame 52, a display 18, a bezel 22, a lower cover 26, and stop blocks 36 and 38. The frame 52 includes the side wall frame 28 and the plate frame 34. The stop blocks 36 and 38 are inserted at both ends of the plate frame 34. The side wall frame 28 of the frame 52 in the electronic apparatus 10A is formed in a frame shape over all four sides, and end portions thereof are connected to each other by a fastener 62. That is, the side wall frame 28 in this case forms a closed rectangle and constitutes the four sides of the chassis. The end portions of the side wall frame 28 may be bonded to each other by welding or the like. In a case where the side wall frame 28 in the electronic apparatus 10A has a rectangular frame shape and has a sufficient strength alone, the plate frame 34 may be omitted. The upper surface side of the side wall frame 28 is covered with the display 18 and the bezel 22 instead of the upper cover 24. The lower surface side of the side wall frame 28 is covered with the lower cover 26 in the similar manner to the above chassis.

Figure 15:
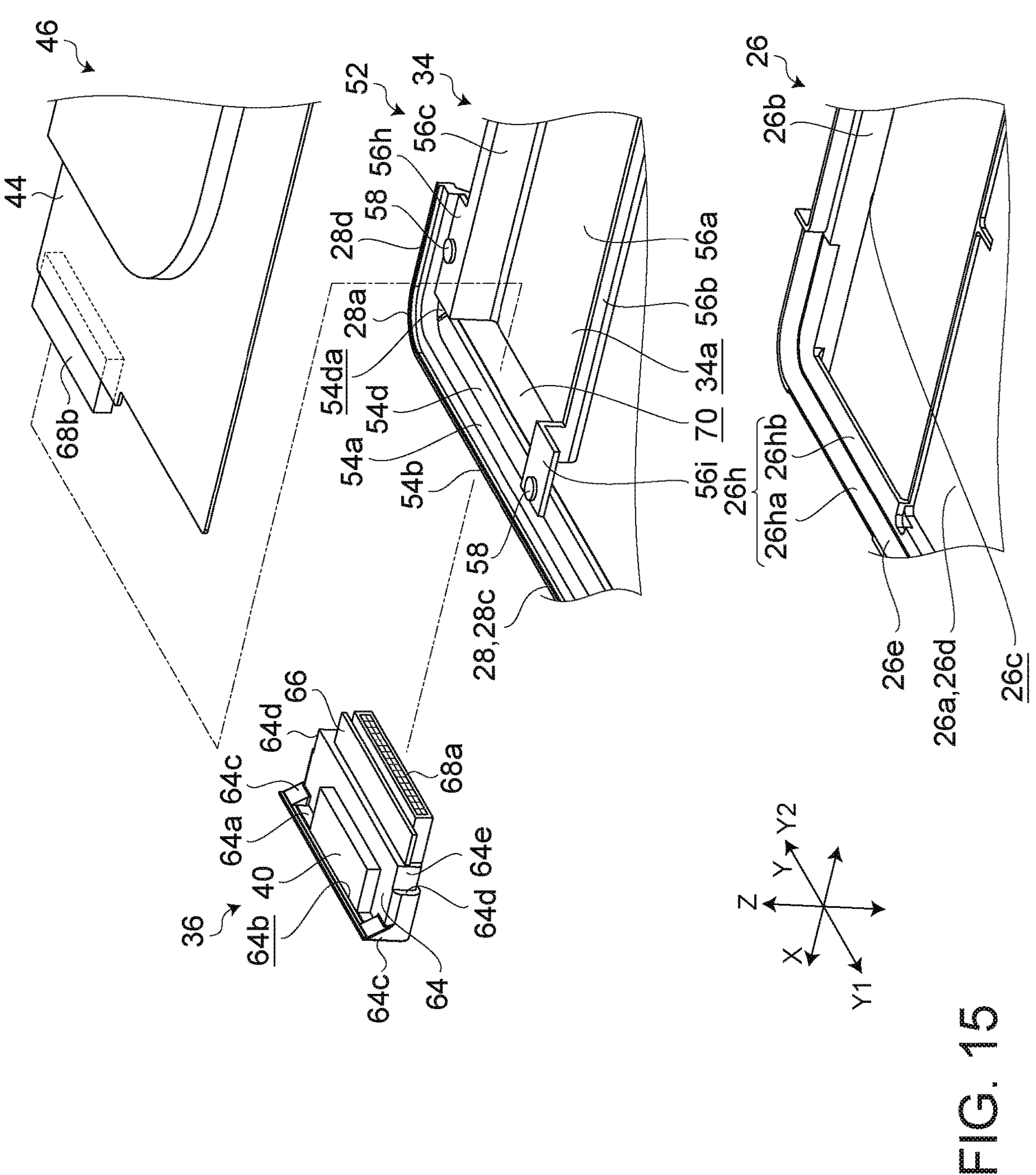
FIG. 15 is an exploded perspective view of a stop block and a portion into which the stop block is inserted.
Figure 16:
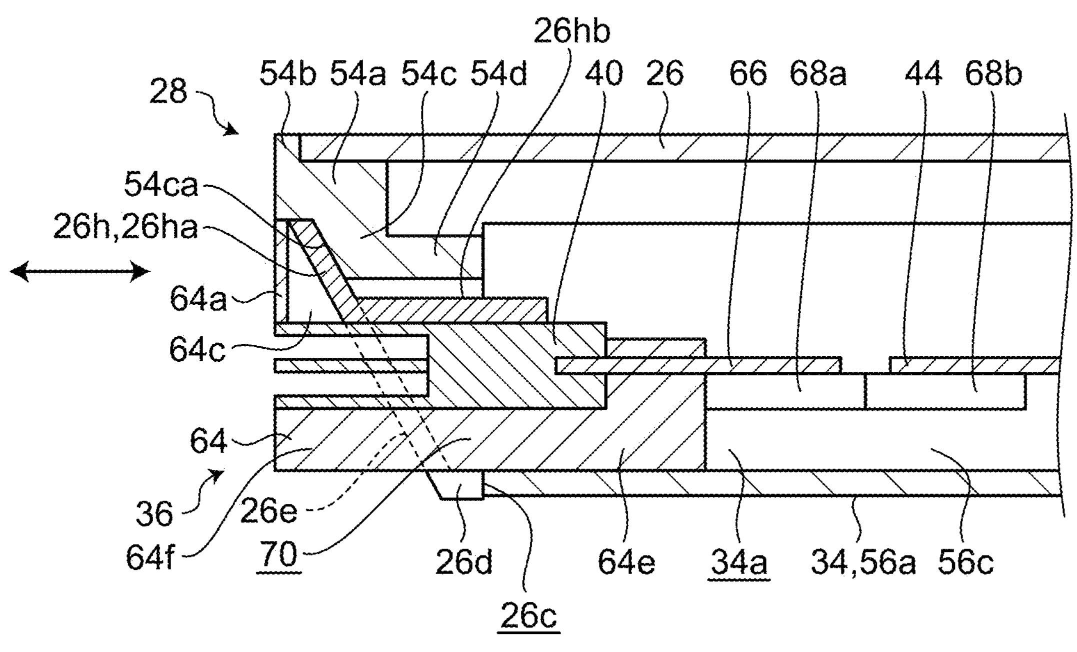
FIG. 16 is a schematic cross-sectional view of the stop block and the portion into which the stop block is inserted.

FIG. 15 is an exploded perspective view of the stop block 36 and a portion into which the stop block 36 is inserted. FIG. 16 is a schematic cross-sectional view of the stop block 36 and the portion into which the stop block 36 is inserted. In addition to the above IO connector 40, the stop block 36 includes a main body 64, a card 66, and a board connection connector 68*a*. The card 66 is a small substrate. The IO connector 40 is mounted on the card 66, and the fitting surface faces the outer side of the frame. The IO connector 40 may be any of a top-mount type, a middle-mount type, or a bottom-mount type. The board connection connector 68*a* is mounted on the card 66, and the fitting surface faces the inner side of the frame. Other components may be mounted on the card 66 as necessary. A part of the card 66 may be insert-molded into the main body 64.

The main body 64 is a flat box shape that is slightly long in the Y direction, and a wall portion 64*a* that protrudes upward is provided on the outer side of the frame. A rectangular notch 64*b* for exposing the IO connector 40 to the outer side of the frame is formed at the wall portion 64*a*. A triangular inclined wall 64*c* is provided at both ends of the wall portion 64*a* in the Y direction as viewed in the Y direction. The inner side of the frame of the inclined wall 64*c* is inclined to be in contact with an inclined plate 26*ha*, which will be described later. A small step 64*d* are formed at both ends of the main body 64 in the Y direction, and the Y-dimension of an insertion portion 64*e* on the inner side of the frame is slightly smaller with the step 64*d* as a boundary. The insertion portion 64*e* is a portion that is inserted into the space 34*a* of the plate frame 34 from a block insertion port 70. The step 64*d* abuts on the end portion of the plate frame 34 to restrict the displacement. The material of the main body 64 may be a metal material from the viewpoint of securing the insertion and extraction strength of a plug with respect to the IO connector 40 and the viewpoint of the exterior design, but may be a resin material depending on the design conditions.

As described above, the rectangular plate frame insertion hole 26*c* in which the plate frame 34 is fitted is formed between the first portion 26*a* on the Y1 side and the second portion 26*b* on the Y2 side of the lower cover 26. At both ends of the plate frame insertion hole 26*c* in the X direction, the bridge portion 26*h* connects the first portion 26*a* and the second portion 26*b*, which have a large width. That is, the bridge portion 26*h* connects the first portion 26*a* and the second portion 26*b* on both sides of the lower cover 26 with the plate frame insertion hole 26*c* interposed. The bridge portion 26*h* is formed by an inclined plate 26*ha* and a horizontal plate 26*hb*, and has an obtuse angle cross section. The inclined plate 26*ha* is continuous with the inclined plate 26*e* in a portion other than the bridge portion 26*h*. The horizontal plate 26*hb* extends from the lower end of the inclined plate 26*ha* toward the inner side of the frame. The horizontal plate 26*hb* is parallel to the plate-shaped portion 56*a* and at least a part thereof overlaps the plate-shaped portion 56*a* in a plan view.

In a case where the lower cover 26 and the frame 52 are combined, the block insertion port 70 that is surrounded on four sides and opens to the outer side of the frame is formed by the horizontal plate 26*hb* of the lower cover 26 and the plate-shaped portion 56*a*, the front partition wall 56*b*, and the rear partition wall 56*c* of the plate frame 34. The stop block 36 is inserted horizontally from the block insertion port 70, the insertion portions 64*e* at both ends of the main body 64 in the Y direction abut on the front partition wall

56*b* and the rear partition wall 56*c*, the lower surface abuts on the plate-shaped portion 56*a*, the upper surface of the IO connector 40 abuts on the horizontal plate 26*hb*, and the stop block 36 is stable in a correct position and direction.

As illustrated in FIG. 16, the inclined plate 26*ha* of the bridge portion 26*h* abuts on the inclined surface 54*ca* of the base portion 54*a* and the lower protruding portion 54*c* of the side wall frame 28, and the horizontal plate 26*hb* abuts on the upper surface of the stop block 36. That is, the lower cover 26 is positioned by the side wall frame 28 and the stop block 36 sandwiching the bridge portion 26*h* which forms a part of the edge portion, and the stop block 36 restricts the lower cover 26 from falling downward.

According to the stop block 36, the lower cover 26 does not need another fixing unit such as a screw with respect to at least the Y2-side end portion and the side wall frame 28 in the vicinity thereof, and the cost is reduced and the maintainability is improved.

Since the side portion of the lower cover 26 is formed obliquely by the inclined plates 26*e* and 26*ha*, the triangular exposed portion 64*f* with the inclined wall 64*c* in the main body 64 as the top portion is exposed without entering the inside of the main body chassis 12. The inclined wall 64*c* and the side wall portion of the side wall frame 28 are on substantially the same plane. A locking mechanism may be provided in the stop block 36 such that the stop block 36 is not carelessly pulled out. The stop block 36 may be entirely or substantially entirely located in the main body chassis 12 so that the exposed portion 64*f* is not provided.

In a case where the lower cover 26 is removed, the bridge portion 26*h* and the stop block 36 overlap each other to provide a stopping action. The lower cover 26 is removable by removing the stop block 36, and the internal components of the chassis 12, such as the touch pad 32, can be accessed. In a case of assembling, a reverse procedure is performed. With such a structure, only a person having the access right can remove the lower cover 26.

A board connection connector 68*b* is mounted on the edge of the main board 44. The board connection connectors 68*a* and 68*b* are horizontal fitting type connectors in which fitting surfaces face each other, and are engageable and disengageable with each other by inserting and removing the stop block 36. The fitting direction of the board connection connectors 68*a* and 68*b* is the same as the fitting direction of the stop block 36 with respect to the space 34*a*, that is, the X direction. In a case in which the IO connector 40 is damaged, only the stop block 36 need be replaced without replacing the main board 44, and the repairability is high. The stop block 36 is cheaper than the main board 44.

A stop block 38 (see FIG. 3) including the IO connector 42 is provided on the right side of the main body chassis 12. The stop block 38 also exhibits the stopping action of the lower cover 26 in the similar manner to the stop block 36 on the left side. As described above, since the right end of the main board 44 is slightly separated from the side wall 28*c*, the main board 44 and the IO connector 42 may be connected to each other via a cable. A connector may be provided in the middle of the cable to be attachable and detachable, and the stop block 38 may also be replaceable.

Figure 17:
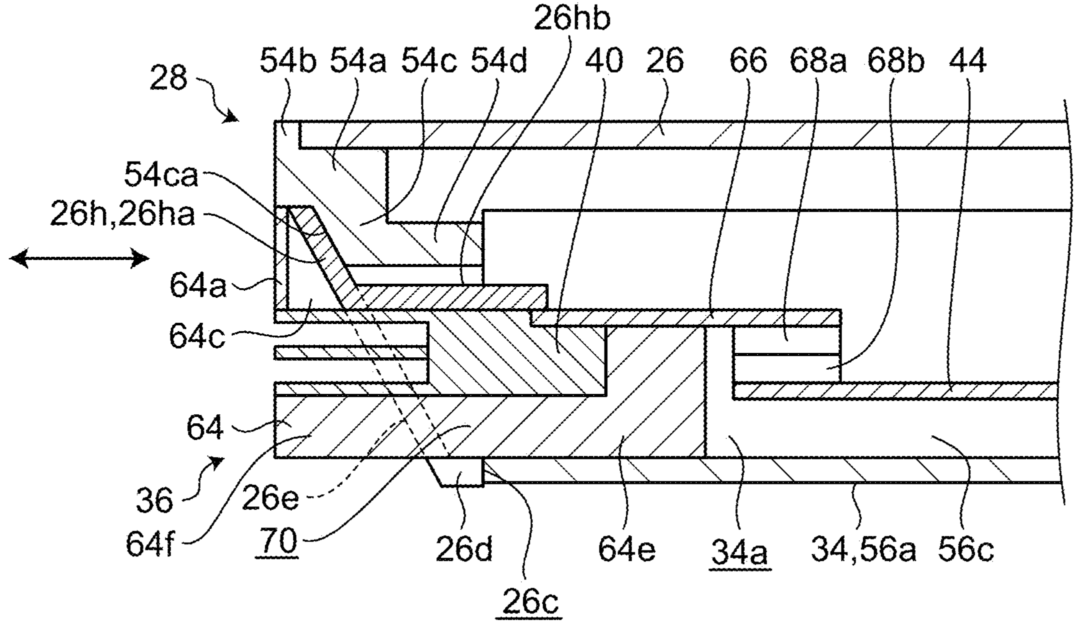
FIG. 17 is a schematic cross-sectional view of a first modification example of the stop block and the portion into which the stop block is inserted.
Figure 18:
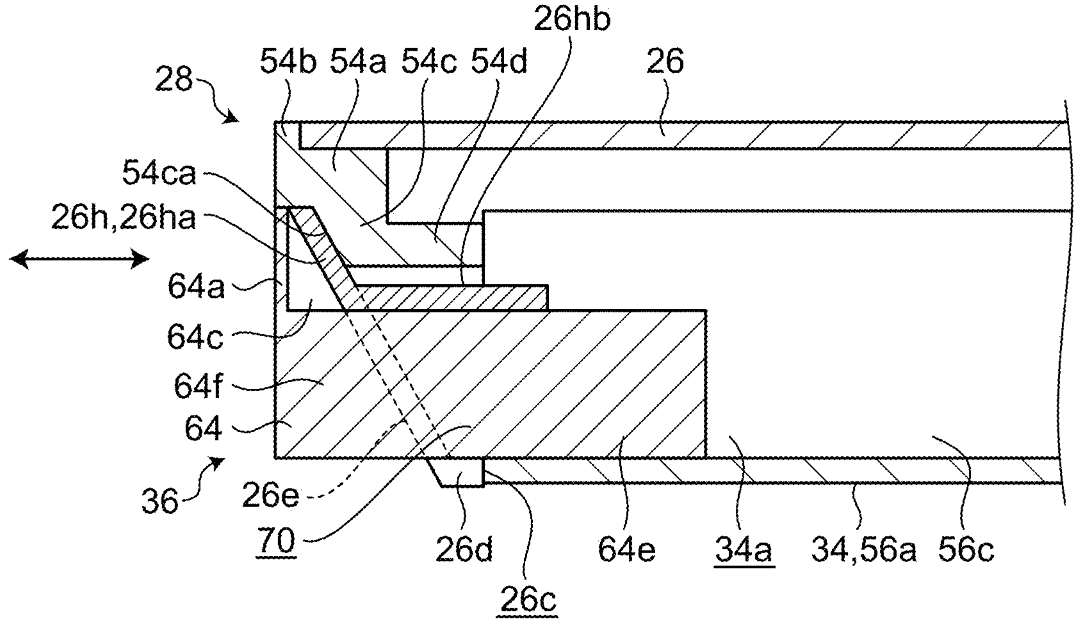
FIG. 18 is a schematic cross-sectional view of a second modification example of the stop block and the portion into which the stop block is inserted.

As illustrated in FIG. 17, the card 66 and the main board 44 may partially overlap with each other on a plane, and the overlapping portions may be connected by the board connection connectors 68*a* and 68*b*. The board connection connectors 68*a* and 68*b* in this case are of a vertical fitting type. As illustrated in FIG. 18, in a case in which the stop block 38 does not include the IO connector 40, the main body 64 may be made thick to abut on the lower surface of the horizontal plate 26*hb*.

Figure 19:
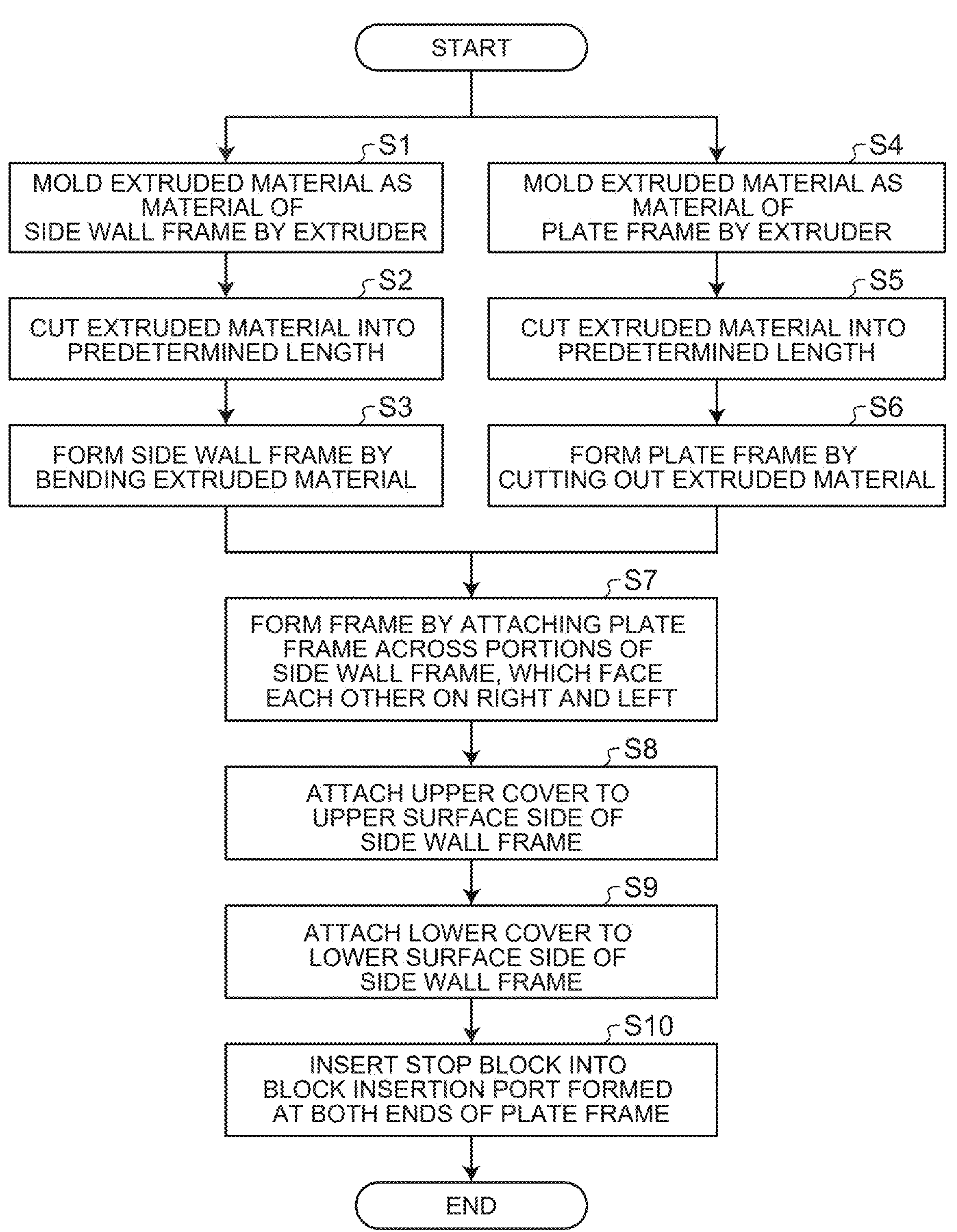
FIG. 19 is a flowchart illustrating a manufacturing method of an electronic apparatus.

FIG. 19 is a flowchart illustrating a manufacturing method of the electronic apparatus 10. In step S1, a billet is extruded by the extruder to form the extruded material 54 to be the material of the side wall frame 28. In step S2, the extruded material 54 is cut to a predetermined length. In step S3, the bent portions 28*a* at four locations bend the extruded material 54 to form the side wall frame 28. The processing order of the four bent portions 28*a* is not limited, but for example, two places on the Y1 side may be bent first, and two places on the Y2 side may be bent thereafter. The inward projecting portion 54*d* in the bent portion 28*a* is formed with a notch 54*da* (see FIG. 15) as necessary.

On the other hand, in a separate step S4, the billet is extruded by the extruder to form an extruded material 56 to be a material of the plate frame 34. In step S5, the extruded material 54 is cut to a predetermined length. In step S6, the partial portions of both the end portions 56*f*, the front notch 56*i*, and the rear notch 56*g* are cut out from the extruded material 56 to form the plate frame 34.

In step S7, the plate frame 34 is attached to the side walls 28*c* facing each other on the right and left in the side wall frame 28 to form the frame 52. In this attachment, as described above, the first outward projecting portion 56*h* at both ends is fixed to the upper surface of the inward projecting portion 54*d* in the side wall 28*d* by the screw 58, and the second outward projecting portion 56*j* at both ends is fixed to the upper surface of the inward projecting portion 54*d* in the side wall 28*c* by the screw 58.

In step S8, the upper cover 24 is attached to the upper surface side of the side wall frame 28. In step S9, the lower cover 26 is attached to the lower surface side of the side wall frame 28. At this time, the block insertion port 70 is formed at both ends of the plate frame 34 by the frame 52 and the lower cover 26. The upper cover 24 and the lower cover 26 are fixed to the side wall frame 28 by, for example, adhesion or a pressure-sensitive adhesive tape. However, since the Y2-side portion of the lower cover 26 is stopped by the stop blocks 36 and 38, only the Y1-side portion may be fixed. The main board 44, the battery 48, and the like are attached to predetermined positions before and after steps S8 and S9.

In step S10, the stop blocks 36 and 38 are inserted into the block insertion ports 70 formed at both ends of the plate frame 34. As a result, the main body chassis 12 is completed. Then, the electronic apparatus 10 is obtained by coupling the main body chassis 12 and the display chassis 14 to each other by the hinge 16 to be pivotable. The step of coupling the main body chassis 12 and the display chassis 14 is performed, for example, at a timing at which the upper cover 24 or the lower cover 26 is not attached to the main body chassis 12, and the cover or the frame 52 is attached to the main body chassis 12 first. In the manufacturing of the electronic apparatus 10, it is not necessary that the same manufacturer performs all the above-described steps, and for example, the extrusion step of steps S1 and S4 may be performed by a specialized manufacturer having an extruder.

In the electronic apparatus 10, the frame 52 may be applied to the display chassis 14. In this case, the display 18 and the bezel 22 may be attached to one surface of the frame 52, the back cover 20 may be attached to the other surface, and the hinge 16 may be disposed in the opening portion 28*e* of the side wall frame 28 of the quadrangular C-shape. In a case in which the frame 52 is applied to the display chassis 14, the back cover 20 may be first attached and integrated with the frame 52, and then the components of the display 18 or the like may be assembled. As described above, in the electronic apparatus 10, the frame 52 may be applied to at least one of the main body chassis 12 or the display chassis 14 that are connected to be relatively pivotable by the hinge 16.

The present invention is not limited to the above-described embodiments, and there is no doubt that the present invention can be freely changed without departing from the gist of the present invention.

DESCRIPTION OF SYMBOLS

10, 10A electronic apparatus
12, 12A, 12B, 12C, 12D main body chassis
14 display chassis
16 hinge
24, 24D upper cover
26, 26B, 26C, 26E lower cover
26*g* inward protrusion
26*ga* slide protrusion
26*gb* protrusion
26*h* bridge portion
26*hb* horizontal plate
28 side wall frame
28*a* bent portion
28*b*, 28*c*, 28*d* side wall
28*e* opening portion
30 keyboard
34*a* space
34, 34A, 34B, 34C, 34D, 34E, 34F, 34G, 34H, 34I, 34J, 34K, 34L plate frame
36, 38 stop block
40, 42 IO connector
44 main board
44*a* CPU (control unit)
48 battery
52, 52A, 52B frame
54, 54A, 54B, 54C, 54D, 54E, 56 extruded material
54*b*, 54*m* upper protruding portion
54*c*, 54*h*, 54*j* lower protruding portion
54*f*, 54*n* upper inner corner portion
54*g*, 54*i*, 54*k* lower inner corner portion
540 groove
54*oa* slide groove
54*ob* engagement groove
56*a* plate-shaped portion
56*b* front partition wall
56*c* rear partition wall
56*h* first outward projecting portion
56*j* second outward projecting portion
60*a* slide groove
60*b* engagement groove
64 main body
66 card
68*a*, 68*b* board connection connector
70 block insertion port

What is claimed is:

1. An electronic apparatus comprising:
a flat rectangular chassis that includes
a side wall frame in which at least three side walls are formed by bending an extruded material,
a cover configured to form one surface of the chassis by being combined with the side wall frame, and
a plate frame that has a plate shape and is provided between facing portions of the three side walls, wherein
the plate frame includes two partition walls having an angle intersecting with a plate-shaped portion, and forms a space surrounded on three sides by the plate-shaped portion and the two partition walls,
a stop block is fitted into the space from a side,
an inclined portion of an edge portion of the cover is sandwiched between the side wall frame and an inclined wall of the stop block, and
an IO connector is provided at the stop block.

2. The electronic apparatus according to claim 1, wherein
a main board including a main control unit is provided in the chassis, and
the IO connector is attachably and detachably connected to the main board.

3. The electronic apparatus according to claim 2, wherein
a card on which the IO connector is mounted is provided in the stop block, and
the card is connected to the main board by a connector.

4. The electronic apparatus according to claim 3, wherein
the card and the main board are connected to each other by a horizontal fitting type connector, and
a fitting direction of the horizontal fitting type connector is the same as a fitting direction of the stop block with respect to the space.

5. The electronic apparatus according to claim 1, wherein
the stop block abuts on the plate-shaped portion and the two partition walls.

6. The electronic apparatus according to claim 1, wherein
a plate frame insertion hole into which the plate frame is fitted is formed in the cover, and
the part of the edge portion is a bridge portion that joins both sides of the cover with the plate frame insertion hole interposed between both the sides.

* * * * *